US010539618B2

(12) United States Patent
Yang

(10) Patent No.: US 10,539,618 B2
(45) Date of Patent: Jan. 21, 2020

(54) HIGH-VOLTAGE CIRCUIT BREAKER OPENING AND CLOSING TIME ONLINE MONITORING APPARATUS, SMART MULTI-DIMENSIONAL BIG DATA ANALYZING EXPERT SYSTEM FOR HIGH-VOLTAGE CIRCUIT BREAKER IN POWER GRID AND METHOD THEREFOR

(71) Applicant: Qibei Yang, Nanning (CN)

(72) Inventor: Qibei Yang, Nanning (CN)

(*) Notice: Subject to any disclaimer, the term of this patent is extended or adjusted under 35 U.S.C. 154(b) by 170 days.

(21) Appl. No.: 15/804,552

(22) Filed: Nov. 6, 2017

(65) Prior Publication Data

US 2018/0059186 A1 Mar. 1, 2018

Related U.S. Application Data

(63) Continuation-in-part of application No. PCT/CN2015/083822, filed on Jul. 10, 2015.

(30) Foreign Application Priority Data

Sep. 30, 2017 (CN) .......................... 2017 1 0927128

(51) Int. Cl.
*G01R 31/327* (2006.01)
*H01H 9/54* (2006.01)
*H02H 1/00* (2006.01)

(52) U.S. Cl.
CPC .......... *G01R 31/3274* (2013.01); *H01H 9/54* (2013.01); *H02H 1/0092* (2013.01)

(58) Field of Classification Search
CPC .. G01R 31/00; G01R 31/327; G01R 31/3271; G01R 31/3272; G01R 31/3274;
(Continued)

(56) References Cited

U.S. PATENT DOCUMENTS 4,263,580 A * 4/1981 Sato ...................... G08C 25/02
340/3.51
5,629,869 A * 5/1997 Johnson ............. H01H 11/0062
361/88
(Continued)

FOREIGN PATENT DOCUMENTS

CN 201689158 U 12/2010
CN 102004223 A 4/2011
(Continued)

OTHER PUBLICATIONS

English translation of International Search Report for PCT/CN2015/083822, dated Jan. 21, 2016, 2 pages.

*Primary Examiner* — Hoai-An D. Nguyen
(74) *Attorney, Agent, or Firm* — Klarquist Sparkman, LLP

(57) ABSTRACT

Provided are a high-voltage circuit breaker opening and closing time online monitoring apparatus, a smart multi-dimensional big data analyzing expert system for a high-voltage circuit breaker in a power grid, and methods therefor. The opening and closing time online monitoring apparatus includes a circuit breaker opening and closing events database, a circuit breaker opening and closing time online monitoring module, and a human machine interaction interface. Data in the circuit breaker opening and closing events database is derived from a SCADA and a measurement and control apparatus thereof, a circuit breaker phase selection opening and closing apparatus, a relay protection apparatus and a relay protection information system, and a fault recording apparatus and a fault recording system of each of a substation and a converter station. The circuit breaker opening and closing time online monitoring module includes various modules, and cloud databases for such online monitoring are created.

17 Claims, 8 Drawing Sheets

(58) Field of Classification Search
CPC .............. G01R 31/3278; G01R 31/333; G01R 31/3333; G01R 31/3336; H01H 1/00; H01H 1/0015; H01H 9/00; H01H 9/54; H02H 1/00; H02H 1/0092; H02H 3/00; H02H 3/02; H02H 3/04; H02H 3/044
USPC ......... 324/415, 416, 418–424; 340/500, 540, 340/635, 638, 286.01, 309.16, 309.6
See application file for complete search history.

(56) References Cited

U.S. PATENT DOCUMENTS

| | | | | |
|---|---|---|---|---|
| 6,172,863 | B1 * | 1/2001 | Ito ........................ | H01H 33/593 |
| | | | | 323/908 |
| 6,472,877 | B1 * | 10/2002 | Sands ................ | G01R 31/3272 |
| | | | | 324/423 |
| 8,004,377 | B2 * | 8/2011 | Brusky ................ | H01H 1/2058 |
| | | | | 324/133 |
| 2016/0124048 | A1 * | 5/2016 | Ashtekar ............ | G01R 31/3272 |
| | | | | 324/424 |

FOREIGN PATENT DOCUMENTS

| | | | |
|---|---|---|---|
| CN | 103457247 | A | 12/2013 |
| KR | 100970005 | B1 | 7/2010 |

* cited by examiner

HIGH-VOLTAGE CIRCUIT BREAKER OPENING AND CLOSING TIME ONLINE MONITORING APPARATUS, SMART MULTI-DIMENSIONAL BIG DATA ANALYZING EXPERT SYSTEM FOR HIGH-VOLTAGE CIRCUIT BREAKER IN POWER GRID AND METHOD THEREFOR

CROSS REFERENCE TO RELATED APPLICATION

This application is a continuation-in-part application based on PCT Application No. PCT/CN2015/083822 filed with the State Intellectual Property Office on Jul. 10, 2015, entitled "Smart Multi-Dimensional Big Data Analyzing Expert System for High-voltage Circuit Breaker in Power Grid", and claims priority to a Chinese Patent Application No. 201710927128.6 filed with the State Intellectual Property Office on Sep. 30, 2017, entitled "Apparatus and Method for Online Monitoring of Opening and Closing Time of High-voltage Circuit Breaker", which are incorporated herein by reference in their entirety.

TECHNICAL FIELD

The present invention relates to the field of smart monitoring of a power grid in a power system, and particularly to a high-voltage circuit breaker opening and closing time online monitoring apparatus (an apparatus for online monitoring of the opening and closing time of a high-voltage circuit breaker), a smart multi-dimensional big data analyzing expert system for a high-voltage circuit breaker in a power grid, and a method therefor.

BACKGROUND ART

A high-voltage circuit breaker is a relatively important switching device in a power system, which plays a very important role in maintaining the safety as well as the economic and reliable running of the power system. The role of the circuit breaker is to switch on or off a power transmission line and an electrical device in accordance with service requirements of the power system. Alternatively, if there is a fault in the power system, the circuit breaker quickly cut off a faulty line or electric device from the power grid upon receiving a trip signal issued by a replay protection apparatus, so as to ensure the normal running of the power system. Therefore, online monitoring and analyzing the running data of the high-voltage circuit breaker to ensure the reliability of the high-voltage circuit breaker is an important condition to ensure the normal running of the power system.

DISCLOSURE OF THE INVENTION

The inventor has found by study that, different from other static electric devices such as transformers, electric reactors and capacitors, the high-voltage circuit breaker has to ensure correct actions in the frequent normal opening and closing operations and provide a cut-off function in the event of a fault, and the opening or closing time and the non-synchronous opening or closing time of the high-voltage circuit breaker are related closely to factors such as insulation over-voltages of electrical devices, synchronous parallel operation of devices, and damage to static and dynamic contacts of the circuit breaker, thus the online monitoring of the opening and closing time of the high-voltage circuit breaker is of important significance for improving the safety and reliability of the circuit breaker and even the whole power grid.

Most of the current systems for monitoring states of power devices are of a hierarchical distributed structure, which consists of sensors, an intelligent electronic device (IED) for state monitoring, and a backend analysis system. For example, the online monitoring of the opening and closing time of a high-voltage circuit breaker device in a power system is mostly carried out by: for example, additionally providing a Hall sensor to acquire the current of opening and closing coils, additionally installing a vibration sensor to acquire a vibration signal of an operating mechanism, additionally providing an opening and closing coil energization sensor to detect the energization time of the coil, additionally providing a voltage sensor to detect a moment at which contacts of the circuit breaker are opened or closed, additionally providing a linear displacement sensor and a digital grating angular velocity encoder to monitor opening and closing speeds of the circuit breaker, thereby monitoring the opening and closing time or the mechanical vibration characteristics of the circuit breaker. The way mentioned above is limited by the addition of more electronic devices and a low accuracy of the sensors, leading to low quality of the online-monitored data about the opening and closing time of the circuit breaker. Moreover, the derivation of a monitoring circuit from the opening and closing circuits further reduces the safety and reliability of the opening and closing operations, and increases the production, running and maintenance workload as well as the operation and maintenance costs. Such practices for online monitoring of the opening and closing time characteristics of the high-voltage circuit breaker can hardly meet the requirements of the practicability and engineering applications.

In view of this, an object of embodiments of the present invention is to provide an apparatus and a method enabling online monitoring of data about the opening and closing time of a high-voltage circuit breaker, without adding any sensors or intelligent electronic devices (IEDs), and without performing installation and debugging during power outage. Such apparatus and method are applicable to high-voltage circuit breakers with various voltage levels and various operating mechanisms, and applicable to GIS (Gas Insulated Switchgear, which is a Gas Insulated Metal-Enclosed Switchgear), HGIS (Hybrid Gas Insulated Switchgear, which is a Hybrid Gas Insulated Metal-Enclosed Switchgear), and AIS (Air Insulated Switchgear, which is an Air Insulated Metal-Enclosed Switchgear) high-voltage switchgears.

Different from the prior art, in the embodiments of the present invention, the monitored data about opening and closing time characteristics of a high-voltage circuit breaker is derived from a measurement and control apparatus, a circuit breaker phase selection opening and closing apparatus, and a supervisory control and data acquisition system (SCADA) of each of a substation and a converter station; a relay protection apparatus and a relay protection information system; and a fault recording apparatus and a fault recording information system. The data described above have been widely applied to power systems due to their maturity, stability and high accuracy, and provide a good foundation for achieving accurate online monitoring of the opening and closing time of the high-voltage circuit breaker.

1. Compositions and Applications of an Embodiment of the Invention

In an embodiment of the present invention, the high-voltage circuit breaker opening and closing time online monitoring apparatus is composed of a circuit breaker opening and closing events database, a circuit breaker opening and closing time online monitoring module, and a human machine interaction interface (which is referred to as HMI for short).

1.1 Circuit Breaker Opening and Closing Events Database

The circuit breaker opening and closing events database includes: a remote communication signal, a remote measurement signal, a remote control signal and a relay protection action signal of the circuit breaker, as well as information about actions of the circuit breaker phase selection opening and closing apparatus, and recorded fault information.

Furthermore, the remote communication signal, the remote measurement signal, the remote control signal and the relay protection action signal of the circuit breaker, as well as the information about actions of the circuit breaker phase selection opening and closing apparatus include information data acquired from a field measurement and control apparatus and the circuit breaker phase selection opening and closing apparatus of each of the substation and the converter station.

Furthermore, the relay protection action signal includes a protection action signal acquired from the relay protection apparatus and the relay protection information system.

Furthermore, the recorded fault information includes recorded fault information data acquired from the fault recording apparatus and a fault recording information system.

1.2 Circuit Breaker Opening and Closing Time Online Monitoring Module

The circuit breaker opening and closing time online monitoring module is composed of an intelligent opening and closing strategy analysis module, an opening time monitoring module, a phase-to-phase non-synchronous opening time monitoring module, a closing time monitoring module, a phase-to-phase non-synchronous closing time monitoring module, a closing-opening time monitoring module, an opening-to-reclosing time monitoring module, an opening-to-reclosing-to-reopening time monitoring module, an opening or closing auxiliary contact switching time monitoring module, and a phase-to-phase non-synchronous opening or closing auxiliary contact switching time monitoring module.

The intelligent opening and closing strategy analysis module is composed of an opening and closing signal cleaning strategy and a big data analysis module, with the opening and closing signal cleaning strategy based on artificial intelligence technology. Opening and closing data of the circuit breaker, which is cleaned out by the intelligent opening and closing strategy analysis module, is input into the nine time monitoring modules, which are the opening time monitoring module, the phase-to-phase non-synchronous opening time monitoring module, the closing time monitoring module, the phase-to-phase non-synchronous closing time monitoring module, the closing-opening time monitoring module, the opening-to-reclosing time monitoring module, the opening-to-reclosing-to-reopening time monitoring module, the opening or closing auxiliary contact switching time monitoring module, and the phase-to-phase non-synchronous opening or closing auxiliary contact switching time monitoring module, so that the nine time monitoring modules calculate out online monitoring results of nine time parameters.

1.3 Human Machine Interaction Interface (HMI)

The human machine interaction interface is used to allow a user to configure, manage, query and analyze the online monitoring results of a certain circuit breaker or circuit breaker cluster, and is mainly a program interface showing the above-mentioned time parameters and other statistical analysis results.

1.4 Data Quality and Accuracy

In the embodiment of the present invention, there is no need to add any sensors or intelligent electronic devices (IEDs), and instead, a comprehensive analysis is carried out by collecting real-time data, historical data and recorded fault data of the existing substation or converter station, so that the opening and closing time of the circuit breaker can be monitored online without causing power outage.

Obviously, in the embodiment of the invention, the accuracy of the monitoring of the opening and closing time of the circuit breaker is based on sampling accuracies of the measurement and control apparatus, the circuit breaker phase selection opening and closing apparatus, the relay protection apparatus and the fault recording apparatus, and resolution of switching value events is more than or equal to 0.1 ms and less than or equal to 1 ms.

1.5 Installation Applications of the Embodiment of the Invention

The high-voltage circuit breaker opening and closing time online monitoring apparatus provided in the embodiment of the present invention can be installed at different substations or traction stations, converter stations and power plants as required, and accurate online monitoring can be performed on a single circuit breaker device or a circuit breaker cluster consisting of multiple circuit breakers. High-voltage circuit breaker opening and closing time online monitoring cloud databases at different hierarchies, such as a single plant site, a dispatch center, a regional power company, and a cross-regional power reliability company, can also be created through power-dedicated network connection, so as to achieve online monitoring with a higher accuracy based on big data, cloud computing and artificial intelligence technologies, and provide more abundant sample data for making an intelligent decision on full life cycle management of the circuit breaker device.

2. Technical Models and Calculation Rules Included in the Embodiment of the Invention A method for implementing the technique of the embodiment of the present invention is performed by: extracting data related to opening and closing operations of a high-voltage circuit breaker, from opening or closing signal data and recorded fault data, the opening or closing signal data being sent by the measurement and control apparatus, the circuit breaker phase selection opening and closing apparatus, and the relay protection apparatus of the substation or converter station; constructing a circuit breaker opening and closing events database; and on this basis, performing, by utilizing big data, cloud computing and artificial intelligence technologies, deep analysis on the data related to the opening and closing operations of the circuit breaker, so as to obtain data about the opening and closing time characteristics of the circuit breaker.

2.1 Technical Models for Monitoring Opening and Closing Time of Circuit Breaker in the Embodiment of the Invention In the embodiment of the present invention, the opening time of the high-voltage circuit breaker refers to a total time required from a moment at which the circuit breaker receives a trip signal, for example, a moment at which a voltage is applied to a trip coil, to a moment at which the circuit breaker breaks so that three-phase arcs are completely extinguished, and the opening time is also called a rated break time or full opening time. The closing time of the high-voltage circuit breaker refers to a period of time required from a moment at which the circuit breaker receives a closing signal, for example, a moment at which a voltage is applied to a closing coil, to a moment at which three-phase main contacts of the circuit breaker are all in contact.

2.1.1 Technical Models for Opening and Closing Time of Circuit Breaker

In the embodiment of the present invention, as an opening or closing signal is taken from the measurement and control apparatus and the relay protection apparatus, and contact positions are taken from auxiliary contacts of an operating mechanism of the circuit breaker main body, the monitored opening or closing time in the embodiment of the present invention includes a period of time during which the opening or closing signal is transmitted in a circuit breaker opening and closing control circuit and a period of time during which the auxiliary contacts of the operating mechanism of the circuit breaker main body are put in place, that is:

$T_{opening\ time} =$
$\quad T_{period\ of\ time\ during\ which\ the\ opening\ signal\ is\ transmitted\ in\ the\ circuit} +$
$\quad T_{period\ of\ time\ during\ which\ opening\ auxiliary\ contacts\ are\ put\ in\ place}$ $T_{closing\ time} =$
$\quad T_{period\ of\ time\ during\ which\ the\ closing\ signal\ is\ transmitted\ in\ the\ circuit} +$
$\quad T_{period\ of\ time\ during\ which\ closing\ auxiliary\ contacts\ are\ put\ in\ place}$ It can be obtained from the above operation rules that, the high-voltage circuit breaker opening and closing time online monitoring apparatus provided in the embodiment of the present invention can also monitor the period of time during which the opening or closing signal is transmitted in the control circuit, and a change trend of the period of time indicates whether the control circuit is in a good state or not.

Based on monitored real-time timestamps of the opening or closing signal, the opening or closing time of a circuit breaker in which three phases are synchronously driven is calculated according to the following rules:

$T_{opening\ time} =$
$\quad T_{moment\ at\ which\ opening\ auxiliary\ contacts\ are\ put\ in\ place} -$
$\quad T_{moment\ at\ which\ an\ opening\ command\ is\ issued} -$
$\quad k_{t\ compensation\ for\ opening}$ $T_{closing\ time} =$
$\quad T_{moment\ at\ which\ closing\ auxiliary\ contacts\ are\ put\ in\ place} -$
$\quad T_{moment\ at\ which\ a\ closing\ or\ reclosing\ command\ is\ issued} -$
$\quad k_{t\ compensation\ for\ closing}$ The opening or closing time of a circuit breaker operated in single phase is calculated according to the following rules:

$T_{single\text{-}phase\ opening\ time} =$
$\quad T_{moment\ at\ which\ opening\ auxiliary\ contacts\ for\ single\ phase\ are\ put\ in\ place} -$
$\quad T_{moment\ at\ which\ a\ single\text{-}phase\ opening\ command\ is\ issued} -$
$\quad k_{t\ compensation\ for\ opening}$ $T_{single\text{-}phase\ closing\ time} =$
$\quad T_{moment\ at\ which\ closing\ auxiliary\ contacts\ for\ single\ phase\ are\ put\ in\ place} -$
$\quad T_{moment\ at\ which\ a\ single\ phase\ closing\ or\ reclosing\ command\ is\ issued} -$
$\quad k_{t\ compensation\ for\ closing}$ $k_{t\ compensation\ for\ opening}$ and $k_{t\ compensation\ for\ closing}$ mentioned above are dynamic time compensation values obtained by performing, based on big data and artificial intelligence technologies, mathematical operations on the circuit breaker opening or closing time monitored according to the invention, the circuit breaker opening or closing time in a power-outage preventive test, the circuit breaker opening or closing time in a handover test, and the period of time during which the opening or closing signal is transmitted in the control circuit.

2.1.2 Technical Model for Phases-to-Phase Non-Synchronous Opening or Closing Time of the Circuit Breaker The phase-to-phase non-synchronous opening or closing time of the circuit breaker refers to a difference between a maximum opening or closing time and a minimum opening or closing time of three phases A, B and C, and the smaller the value of the difference is, the better the synchronization is. The synchronization of opening or closing of the circuit breaker should satisfy the following condition: the phase-to-phase non-synchronous closing time is not more than 5 ms, and the phase-to-phase non-synchronous opening time is not more than 3 ms.

2.1.3 Technical Model for Closing-Opening Time of the Circuit Breaker

The closing-opening time generally refers to a period of time during which, in response to the circuit breaker getting closed due to a fault, an opening signal issued by the relay protection apparatus causes the circuit breaker to accelerate the opening and then break a fault current. The closing-opening time is an important parameter of the circuit breaker device, which reflects the mechanical properties of the circuit breaker, and the insulation strength and the arc extinguishing capability of an arc extinguishing chamber. The calculation rule of the closing-opening time is as follows:

$T_{closing\text{-}opening\ time} =$
$\quad T_{moment\ at\ which\ opening\ auxiliary\ contacts\ are\ put\ in\ place} -$
$\quad T_{moment\ at\ which\ a\ closing\ or\ reclosing\ signal\ is\ issued} -$
$\quad k_{t\ compensation\ for\ closing\text{-}opening}$ $k_{t\ compensation\ for\ closing\text{-}opening}$ is a dynamic time compensation value obtained by performing, based on the big data and artificial intelligence technologies, mathematical operations on the circuit breaker opening or closing time monitored according to the embodiment of the present invention, the circuit breaker opening or closing time in the power-outage preventive test, the circuit breaker opening or closing time in the handover test, and the period of time during which the opening or closing signal is transmitted in the control circuit.

2.1.4 Technical Model for Opening-to-Reclosing Time of Circuit Breaker

The opening-to-reclosing time refers to a period of time during which, in response to the circuit breaker getting opened due to a fault, a reclosing signal issued by the relay protection apparatus causes the circuit breaker to accelerate the closing and carry a load current. The calculation rule of the opening-to-reclosing time is as follows:

$T_{opening\text{-}to\text{-}reclosing\ time} =$
$\quad T_{moment\ at\ which\ closing\ auxiliary\ contacts\ are\ put\ in\ place} -$
$\quad T_{moment\ at\ which\ an\ opening\ command\ signal\ is\ issued} -$
$\quad k_{t\ compensation\ for\ opening\text{-}reclosing}$ $k_{t\ compensation\ for\ opening\text{-}reclosing}$ is a dynamic time compensation value obtained by performing, based on the big data and artificial intelligence technologies, mathematical operations on the circuit breaker opening or closing time monitored according to the present invention, the circuit breaker opening or closing time in the power-outage preventive test, the circuit breaker opening or closing time in the handover test, and the period of time during which the opening or closing signal is transmitted in the control circuit.

2.1.5 Technical Model for Opening-to-Reclosing-to-Reopening Time of Circuit Breaker The opening-to-reclosing-to-reopening time refers to a period of time during which, in response to the circuit breaker getting opened due to a fault, the relay protection apparatus issues a trip signal, the circuit breaker breaks a fault current, a reclosing apparatus issues a reclosing signal so that the circuit breaker is closed and carries the fault current, and the relay protection apparatus issues the trip signal again so that the circuit breaker breaks the fault current. The calculation rule of the opening-to-reclosing-to-reopening time is as follows:

$$T_{opening\text{-}to\text{-}reclosing\text{-}to\text{-}reopening\ time} = \\ T_{moment\ at\ which\ opening\ auxiliary\ contacts\ are\ put\ in\ place\ for\ the\ second\ time} - \\ T_{moment\ at\ which\ the\ opening\ signal\ is\ firstly\ issued} - \\ k_{t\ compensation\ for\ opening\text{-}to\text{-}reclosing\text{-}to\text{-}reopening}$$

$k_{t\ compensation\ for\ opening\text{-}to\text{-}reclosing\text{-}to\text{-}reopening}$ is a dynamic time compensation value obtained by performing, based on the big data and artificial intelligence technologies, mathematical operations on the circuit breaker opening or closing time monitored according to the embodiment of the present invention, the circuit breaker opening or closing time in the power-outage preventive test, the circuit breaker opening or closing time in the handover test, and the period of time during which the opening or closing signal is transmitted in the control circuit.

2.1.6 Technical Model for Auxiliary Contact Switching Time of Circuit Breaker In general, auxiliary contacts of the circuit breaker are mechanically driven in synchronization with main contacts of primary devices, which truly reflect the running state of the main contacts of the primary devices, and are commonly used in an electrical control circuit for interlocking control of electric devices and used to provide switch value information for the relay protection apparatus and an automatic safety apparatus, and serve as a bridge between the primary devices and secondary devices. Therefore, the opening or closing state of the circuit breaker is introduced into the electrical control circuit through the mechanical auxiliary contacts, and the auxiliary contacts are closed or opened under the action of a mechanical force. Obviously, as the auxiliary contacts are related closely to the primary contacts, a trend of change in the opening or closing auxiliary contact switching time also reflects the period of time during which the primary main contacts are put in place for opening or closing.

During the actual operation of the circuit breaker, in the case of the opening of the circuit breaker, primary high-voltage main contacts of the circuit breaker are switched from a closed position to an open position, and secondary auxiliary contacts are synchronously switched from a closed position to an open position, and in this case, a calculation rule of the opening auxiliary contact switching time is as follows:

$$T_{opening\ auxiliary\ contact\ switching} = \\ T_{moment\ at\ which\ opening\ auxiliary\ contacts\ are\ closed} - \\ T_{moment\ at\ which\ closing\ auxiliary\ contacts\ are\ opened} - \\ k_{t\ compensation\ for\ opening\ auxiliary\ contacts\ switching}$$

In the case of the closing of the circuit breaker, the primary high-voltage main contacts of the circuit breaker are switched from the open position to the closed position, and the secondary auxiliary contacts are synchronously switched from the open position to the closed position, and in this case, a calculation rule of the closing auxiliary contact switching time is as follows:

$$T_{closing\ auxiliary\ contact\ switching} = \\ T_{moment\ at\ which\ closing\ auxiliary\ contacts\ are\ closed} - \\ T_{moment\ at\ which\ opening\ auxiliary\ contacts\ are\ opened} - \\ k_{t\ compensation\ for\ closing\ auxiliary\ contact\ switching}$$

$k_{t\ compensation\ for\ opening\ auxiliary\ contact\ switching}$ and $k_{t\ compensation\ for\ closing\ auxiliary\ contact\ switching}$ are dynamic time compensation values obtained by performing, based on the big data and artificial intelligence technologies, mathematical operations on the circuit breaker opening or closing time monitored according to the embodiment of the present invention, the circuit breaker opening or closing time in the power-outage preventive test, the circuit breaker opening or closing time in the handover test, and the period of time during which the opening or closing signal is transmitted in the control circuit.

2.1.7 Technical Model for Phase-to-Phase Non-Synchronization Opening or Closing Auxiliary Contact Switching Time of Circuit Breaker In the embodiment of the present invention, the phase-to-phase non-synchronous opening or closing auxiliary contact switching time of the circuit breaker is monitored and analyzed. The phase-to-phase non-synchronous opening or closing auxiliary contact switching time refers to a difference between a maximum switching time and a minimum switching time of the three phases A, B and C, and the smaller a value of the difference is, the better the synchronization is. The synchronization of the opening or closing auxiliary contact switching should satisfy the following condition: the phase-to-phase non-synchronous closing time is less than or equal to 5 ms, and the phase-to-phase non-synchronous opening time is less than or equal to 3 ms.

2.2 Effects of Dynamic Time Compensation Values $k_t$

A conventional integrated automation substation is greatly different from a digital substation and an intelligent substation in terms of the relay protection apparatus, the measurement and control apparatus, the circuit breaker phase selection opening and closing apparatus, the fault recording apparatus and the opening and closing control circuit and an alarm signal circuit. The technical models listed above in section 2.1 use the dynamic time compensation values kt to offset time delays of opening or closing signals corresponding to different physical links, thus making the online monitored results closer to the original manufacturing characteristics of the circuit breaker main body.

3. Method for Implementation of the Embodiment of the Invention

The embodiment of the present invention also provides a method for online monitoring of the circuit breaker opening and closing time using the technical models for the online monitoring of the opening and closing time of a high-voltage circuit breaker mentioned previously, and the method includes steps of:

S111: acquiring, from a SCADA system, a field measurement and control apparatus and a circuit breaker phase selection opening and closing apparatus of each of a substation and a converter station, real-time data and historical data of a remote communication signal, a remote measurement signal, a remote control signal and a relay protection action signal of the circuit breaker, as well as information about actions of the circuit breaker phase selection opening and closing apparatus and the like;

S112: acquiring protection action information from a relay protection information system and a relay protection apparatus;

S113: acquiring recorded fault information from a fault recording system and a fault recording apparatus;

S114: extracting and cleaning the protection action information, the recorded fault information and the real-time data and historical data thereof, and generating a circuit breaker opening and closing events database;

S115: extracting, by using an intelligent opening and closing strategy analysis strategy module, signal data related to opening and closing actions of the circuit breaker from the circuit breaker opening and closing events database, where the intelligent opening and closing strategy analysis strategy module is composed by an opening and closing signal cleaning strategy module and a big data analysis module, with the opening and closing signal cleaning strategy module based on artificial intelligence technology;

S116: sending the signal data extracted by the intelligent opening and closing strategy analysis module to nine time monitoring modules simultaneously for comprehensive analysis as follows:

calculating, by an opening time monitoring module, a circuit breaker opening time;

calculating, by a phase-to-phase non-synchronous opening time monitoring module, a phase-to-phase non-synchronous opening time;

calculating, by a closing time monitoring module, a circuit breaker closing time;

calculating, by a phase-to-phase non-synchronous closing time monitoring module, a phase-to-phase non-synchronous closing time;

calculating, by a closing-opening time monitoring module, a closing-opening time;

calculating, by an opening-to-reclosing time monitoring module, an opening-to-reclosing time, calculating, by an opening-to-reclosing-to-reopening time monitoring module, an opening-to-reclosing-to-reopening time;

calculating, by an opening or closing auxiliary contact switching time monitoring module, an opening or closing auxiliary contact switching time; and calculating, by a phase-to-phase non-synchronous opening or closing auxiliary contact switching time monitoring module, a phase-to-phase non-synchronous opening or closing auxiliary contact switching time;

S117: performing, by utilizing artificial intelligence, big data analysis and cloud computing technologies, data mining on time parameters and historical data thereof of each of the substation and the converter station to provide the following functions, the time parameters and historical data thereof being in the online monitoring cloud database:

a first function: comparing and ranking the time of manual opening or closing, and paying attention to a trend of historical change in the time of manual opening or closing;

a second function: comparing and ranking the opening or closing time, and paying attention to a trend of historical change in the phase-to-phase non-synchronous opening or closing time;

a third function: ranking a protective opening and reclosing time, and paying attention to a trend of historical change in the protective opening and reclosing time;

a fourth function: analyzing, for successful opening-to-reclosing and for opening-to-reclosing-to-reopening, the circuit breaker control circuit and mechanical action characteristics of the circuit breaker main body, and paying attention to trends of historical changes in the circuit breaker control circuit and the mechanical action characteristics of the circuit breaker main body over time;

a fifth function: acquiring information about an operation command issued by the SCADA, information about the circuit breaker phase selection opening and closing apparatus, and a moment at which positions of auxiliary contacts of the circuit breaker are changed, and inspecting whether the circuit breaker phase selection opening and closing apparatus accurately responds to the operation command issued by the SCADA;

a sixth function: monitoring and calculating a period of time required from a moment at which an opening or closing signal is issued to a moment at which an opening or closing action of the circuit breaker is completed, and ranking the period of time in terms of change in length, so as to judge whether the opening and closing control circuit and the circuit breaker main body are in a good state;

a seventh function: performing, for a circuit breaker in which three phases are synchronously driven, a statistical analysis of a change trend of the closing-opening time of the circuit breaker; and performing, for a circuit breaker operated in single phase, a statistical analysis of a change trend of the closing-opening time for each of the three phases;

an eighth function: ranking the opening auxiliary contact switching time and the closing auxiliary contact switching time in terms of length, respectively, and paying attention to the trends of historical changes in the opening auxiliary contact switching time and the closing auxiliary contact switching time; and a ninth function: monitoring the opening time, the closing time, the phase-to-phase non-synchronous opening time, the phase-to-phase non-synchronous closing time and the phase-to-phase non-synchronous opening or closing auxiliary contact switching time, and sending a warning and incorporating the warning into a warning list if the opening time, the closing time, the phase-to-phase non-synchronous opening time, the phase-to-phase non-synchronous closing time or the phase-to-phase non-synchronous opening or closing auxiliary contact switching time exceeds a threshold value.

The above functions will be used to diagnose an abnormality of the operating mechanism of the circuit breaker main body, an abnormality of the control circuit, and an abnormality of the circuit breaker phase selection opening and closing apparatus.

On the basis of performing online monitoring on the opening and closing time of a high-voltage circuit breaker in the above-mentioned manner, the inventor has also found by study that, AC and DC power systems have a large number of circuit breaker elements, and these circuit breaker elements require to be intelligently monitored and controlled in real time. A common technical measure is to utilize a measurement and control apparatus to transmit positional signals of a circuit breaker and its auxiliary mechanism to a remote monitoring system, and the monitoring system then performs remote monitoring and control on the circuit breaker.

In electrical devices of a power system, the circuit breaker is one of the important control devices. The reliability of the circuit breaker is related directly to the safety and stability of the whole system, and many major accidents or the disaggregation and power outage of the system are related to a failure of the circuit breaker. As a core element of the power system, the circuit breaker has an extremely important effect in maintaining and ensuring the stable running of the power system. Main failures of the circuit breaker include mechanical failures, insulation failure, arc-extinguishing failure, heat faults of conductor parts and so on, with the mechanical failures occurring most frequently. Therefore, the timely understanding of the working state of the circuit breaker has a huge effect on the improvement of the reliability of power supply. Traditional circuit breaker online monitoring apparatuses mainly monitor parameters such as the number of mechanical operations of the circuit breaker and the cumulative running time of the switch. Most of the monitoring apparatuses have relatively simple functions, and are of little value for widespread engineering applications as the data obtained by online monitoring of such apparatuses is not of high quality and is obtained at great cost.

Furthermore, various data from the existing automation systems are isolated from one another, and the integrated data of the circuit breaker are not specially summarized and analyzed. Therefore, the working condition of the circuit breaker cannot be evaluated, and thus a large amount of real-time monitored data would lose their deserved value, which is not beneficial to economically maintain and manage the circuit breaker in the system. Consequently, it is difficult to timely perform scientific maintenance on the circuit breaker, which leads to progressive accumulation of major potential security hazards, and brings about great risks to the security of the power grid and personal safety.

In view of this, another object of the embodiments of the present invention is to provide a smart multi-dimensional big data analyzing expert system for a high-voltage circuit breaker in a power grid, which is a smart expert system for performing real-time monitoring and carrying out multi-dimensional big data analysis to a high-voltage circuit breaker in a power grid, and can monitor in real time whether the circuit breaker is in a normal state, and gather a vast amount of cloud data from real-time monitoring, technical supervision, security risk evaluation, warehoused spare parts and the like, to provide a decision basis for performing scientific maintenance and management with the help of the smart multi-dimensional big data analysis function.

The embodiments of the present invention provide a smart multi-dimensional big data analyzing expert system for a high-voltage circuit breaker in a power grid. The smart multi-dimensional big data analyzing expert system for a high-voltage circuit breaker in a power grid includes a high-voltage circuit breaker opening and closing time online monitoring apparatus as described above. The smart multi-dimensional big data analyzing expert system for a high-voltage circuit breaker in a power grid includes a high-voltage circuit breaker or high-voltage circuit breaker cluster (hereinafter collectively referred to as the circuit breaker) cloud database and a smart expert decision terminal. Data about opening and closing time characteristics of a high-voltage circuit breaker is obtained by online monitoring of the high-voltage circuit breaker opening and closing time online monitoring apparatus, and the data is derived from a measurement and control apparatus, a circuit breaker phase selection opening and closing apparatus, and a supervisory control and data acquisition system of each of a substation and a converter station; a relay protection apparatus and a relay protection information system; and a fault recording apparatus and a fault recording information system. The circuit breaker cluster cloud database includes a real-time circuit breaker monitoring database, a circuit breaker technique supervision database, a circuit breaker security risk technical indicator database and a circuit breaker warehouse spare part database. The smart expert decision terminal includes a device security risk evaluation module, an optimal device maintenance solution ranking module and a mobile terminal online dynamic warning module. The circuit breaker cluster cloud database dynamically acquires data, and the smart expert decision terminal performs history data analysis, trend analysis, variable analysis, comparison analysis and factor analysis on the acquired data.

Furthermore, the real-time circuit breaker monitoring database includes a working voltage, a working current, states of opening and closing coils, positions of three-phase contacts, a counter for opening and closing actions, the state of an operating mechanism, a counter for actions of applying a voltage to a motor, the pressure of SF6 gas, the position of an isolation switch, and the position of a grounded knife switch, which are acquired from a substation automation system and a field measurement and control apparatus.

Furthermore, data in the real-time circuit breaker monitoring database also includes action processes and breaking current values of the circuit breaker, which are acquired from a relay protection management information system, a circuit breaker protection apparatus, a line protection apparatus and a relevant-element (e.g., a main transformer, a bus, a reactor and a capacitor) protection apparatus.

Furthermore, the data in the real-time circuit breaker monitoring database also includes a value of a fault current broken by the circuit breaker and an action process of the three-phase contacts, which are acquired from a fault recording apparatus.

Furthermore, data in the circuit breaker technique supervision database includes inherent design parameters of the circuit breaker, and the inherent design parameters include waveforms of opening and closing operations, opening and closing speeds, opening and closing time, overtravel, opening range, bounce, voltage and current of opening and closing coils, as well as an action time and power of an iron core.

The embodiments of the present invention also provide a method of monitoring a circuit breaker using the previously mentioned smart multi-dimensional big data analyzing expert system for a high-voltage circuit breaker in a power grid, and the method includes the following steps:

step S211: obtaining, by the high-voltage circuit breaker opening and closing time online monitoring apparatus described above, online-monitored data about opening and closing time characteristics of a high-voltage circuit breaker, and acquiring, from a substation automation system and a field measurement and control apparatus, working parameters of a high-voltage circuit breaker in a power grid, where the working parameters in the power grid include a working voltage and a working current of the circuit breaker, states of opening and closing coils, positions of three-phase contacts, a counter for opening and closing actions, a state of an operating mechanism, a counter for actions of applying a voltage to a motor, a pressure of SF6 gas, a position of an isolation switch, and a position of a grounded knife switch;

step S212: acquiring action processes and breaking current values of the circuit breaker, from a relay protection management information system, a circuit breaker protection apparatus, a line protection apparatus, and a relevant-element protection apparatus of the substation;

step S213: acquiring, from a fault recording apparatus, a value of a fault current broken by the circuit breaker and an action process of the three-phase contacts;

step S214: acquiring, from a circuit breaker cluster cloud database, inherent parameters related to the circuit breaker, where the inherent parameters include national technical standards for circuit breakers, design parameters of manufacturers of circuit breakers, debugging and acceptance parameters, device defect records, device reliability statistics, action characteristic inspection, power-outage preventive test and SF6 gas inspection;

step S215: performing history data analysis, trend analysis, variable analysis, comparison analysis and factor analysis, based on the acquired working parameters of the circuit breaker and the acquired inherent parameters related to the circuit breaker; and step S216: invoking, based on the analysis results, a device security risk evaluation module, an optimal device maintenance solution ranking module and a mobile terminal online dynamic warning module, to obtain a running and maintenance decision recommendation.

Furthermore, the circuit breaker cluster cloud database includes a real-time circuit breaker monitoring database for providing real-time working parameters of the circuit breaker, a circuit breaker technique supervision database for providing inherent parameters of the circuit breaker, a circuit breaker security risk technical indicator database for providing security risk technical indicators of the circuit breaker, and a circuit breaker warehouse spare part database for providing specification data of the circuit breaker.

Furthermore, data in the circuit breaker technique supervision database for providing inherent parameters of the circuit breaker includes: waveforms of opening and closing operations, opening and closing speeds, opening and closing time, overtravel, opening range, bounce, voltage and current of opening and closing coils, as well as an action time and power of an iron core.

Furthermore, the circuit breaker security risk technical indicator database for providing security risk technical indicators of the circuit breaker includes a power grid system risk database, a circuit breaker ontological risk database, and an inspection and repair task risk database.

Furthermore, data in the circuit breaker warehouse spare part database for providing specification data of the circuit breaker include specification parameters, with the specification parameters including: the brand of a main device; and names, specifications and model numbers of spare parts, and so on.

With the above solution, it removes the isolation of information on the circuit breaker in eight areas, with the eight area including a substation automation system, a relay protection management information system, a fault recording management system, an online monitoring system, a warehouse spare part management system, a preventive test technique supervision and management system, a running and maintenance management system, and an original device supervising manufacture and detection monitoring system, and it is a system for providing, based on wide area information technology, online monitoring and dynamic evaluation as well as warning and management control to a circuit breaker device.

The smart multi-dimensional big data analyzing expert system for a high-voltage circuit breaker in a power grid provided in the embodiments of the present invention has the following advantages over the prior art:

1. High-quality data are extracted separately from an automation system, a measurement and control apparatus, a relay protection apparatus, a relay protection management information system, a fault recording apparatus, and various cloud databases such as a technical supervision database and a warehouse spare part database, and unique processional databases are created for circuit breaker elements, so as to lay the foundation for smart analysis.

2. Not only a single circuit breaker is intelligently monitored, but also a cluster of circuit breakers (different voltage levels, different model numbers, different regions, different batches, and different operating mechanisms) can be intelligently monitored.

3. The smart multi-dimensional big data analysis is established on the basis of a real-time circuit breaker monitoring database, a circuit breaker technique supervision database, a circuit breaker security risk technical indicator database and a circuit breaker warehouse spare part database, and thus has a high reliability, and the above four databases can be upgraded automatically or manually as needed.

4. A circuit breaker device state security risk evaluation function and an optimal device maintenance solution ranking function can be provided, the blindness of inspection and repair of the circuit breaker during power outage in the power system can be reduced, and the power supply cost can be reduced.

5. It is possible to interface with spare part inventories for warehousing and logistics, which facilitates the deployment of inspection and repair resources and inventory management inside a company, improves the inventory turnover ratio, and saves warehousing and logistics funds.

6. Online dynamic warning over a mobile terminal (a hand phone, a tablet computer, a notebook computer, or the like) can be achieved.

Other features and advantages of the embodiments of the present invention will be set forth in the following description, and will partially become apparent from the description or be understood by implementation of the invention. The objects and other advantages of the invention are achieved and attained by the structures particularly indicated in the description, the claims and the drawings.

For a clearer and easier understanding of the foregoing objects, features and advantages of the embodiments of the present invention, preferred embodiments will be described hereinafter by way of embodiments and explained in detail as follows with reference to the drawings.

BRIEF DESCRIPTION OF THE DRAWINGS

For illustrating technical solutions in specific embodiments of the present invention or in the prior art more clearly, drawings required for the description of the specific embodiments or of the prior art will be introduced briefly below. It is apparent that the drawings in the description below are merely illustrative of some embodiments of the present invention. It would be understood by those skilled in the art that other relevant drawings could also be obtained from these drawings without any inventive effort.

DETAILED DESCRIPTION OF EMBODIMENTS

The current online monitoring of the opening and closing time of a high-voltage circuit breaker device in a power system does not have a high accuracy and causes an increase of additional production, running and maintenance workload as well as operation and maintenance costs. Such practices for online monitoring of the opening and closing time characteristics of the high-voltage circuit breaker can hardly meet the requirements of the practicability and engineering applications.

On this basis, the apparatus and method for online monitoring of the opening and closing time of a high-voltage circuit breaker provided by the embodiments of the present invention can monitor the opening and closing time characteristics of the high-voltage circuit breaker with a high accuracy without causing power outage.

For facilitating the understanding of the embodiments, a high-voltage circuit breaker opening and closing time online monitoring apparatus as disclosed in the embodiments of the present invention will be introduced in detail first.

1. Compositions and Applications of Embodiment of the Invention

Figure 1:
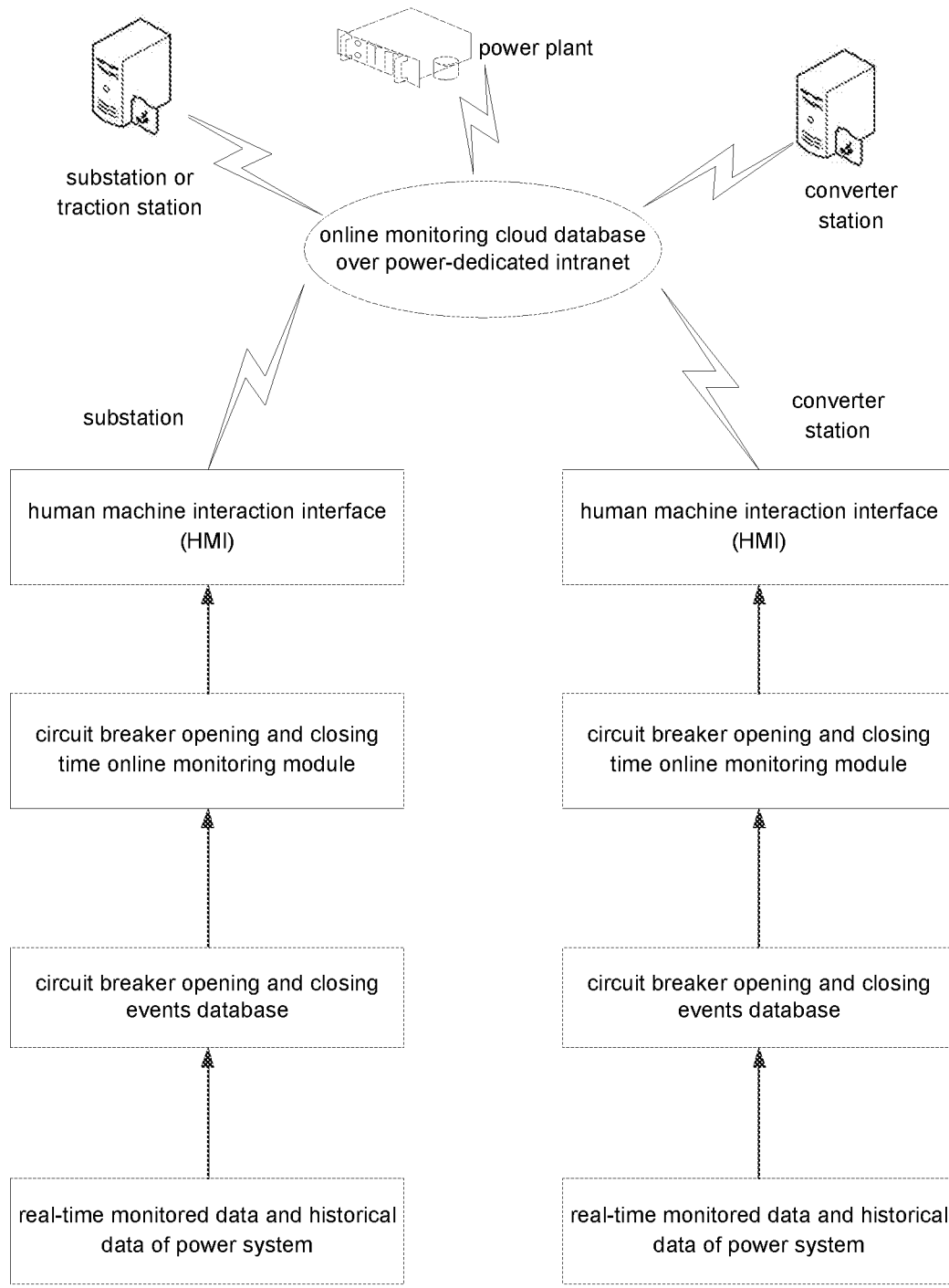
FIG. 1 is a schematic diagram of a high-voltage circuit breaker opening and closing time online monitoring apparatus according to an embodiment of the present invention.

Referring to FIG. 1, a schematic diagram of a high-voltage circuit breaker opening and closing time online monitoring apparatus according to an embodiment of the present invention is shown. The high-voltage circuit breaker opening and closing time online monitoring apparatus in the embodiment of the present invention is composed of a circuit breaker opening and closing events database, a circuit breaker opening and closing time online monitoring module, and a human machine interaction interface (HMI).

The high-voltage circuit breaker opening and closing time online monitoring apparatus provided in the embodiment of the present invention can be installed at different substations, traction stations, converter stations or power plants, so as to perform accurate online monitoring of a single circuit breaker device or a circuit breaker cluster consisting of multiple circuit breakers. High-voltage circuit breaker opening and closing time online monitoring cloud databases at different hierarchies, such as a single plant site, a dispatch center, a regional power company, and a cross-regional power reliability company, can also be created through power-dedicated network connection, so as to achieve online monitoring with a higher accuracy based on big data, cloud computing and artificial intelligence technologies, and provide more abundant sample data for making an intelligent decision on full life cycle management of the circuit breaker device.

1.1 Circuit Breaker Opening and Closing Events Database

Figure 2:
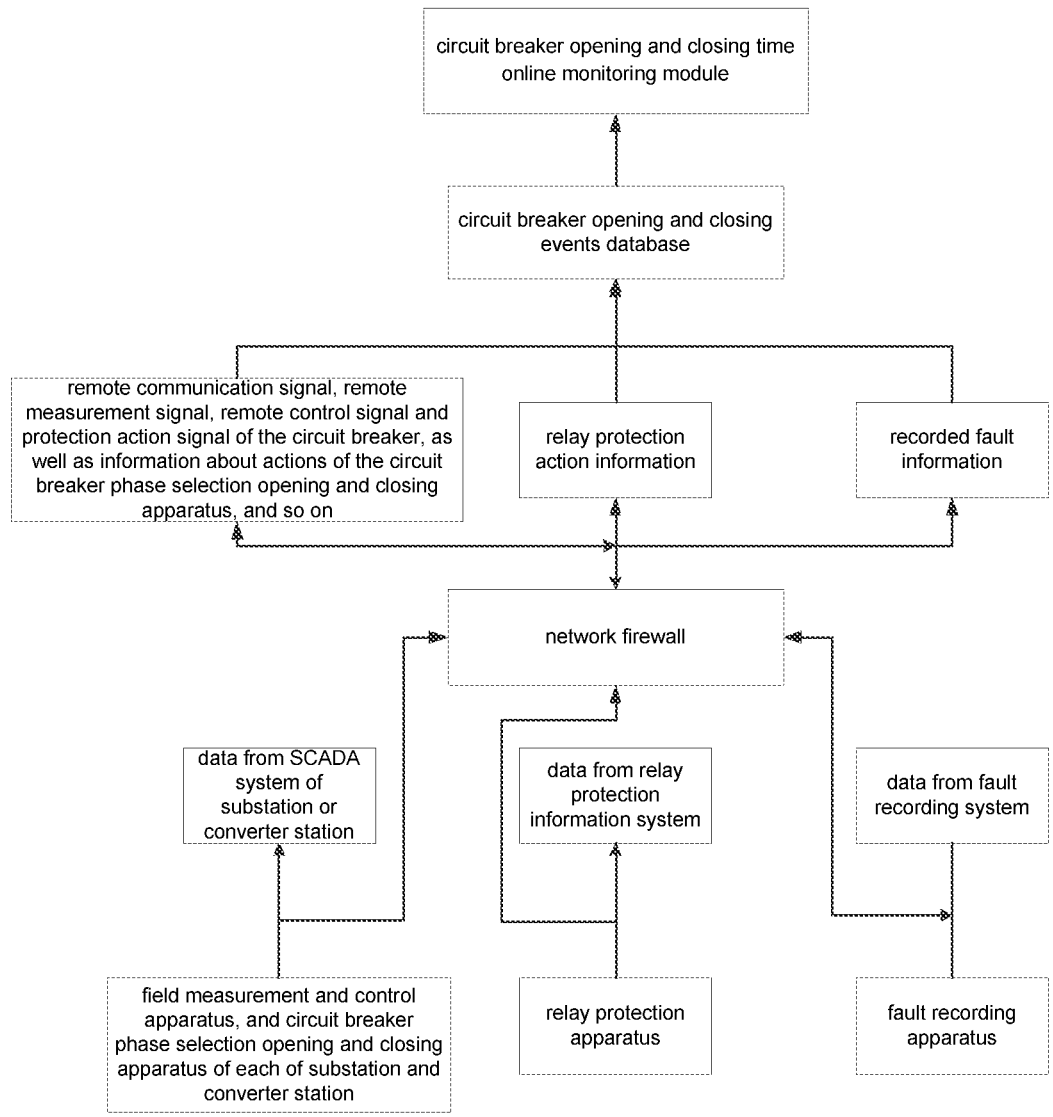
FIG. 2 is a schematic diagram of a high-voltage circuit breaker opening and closing events database according to an embodiment of the present invention.

With reference to FIG. 2, the circuit breaker opening and closing events database includes: a remote communication signal, a remote measurement signal, a remote control signal and a relay protection action signal of the circuit breaker, as well as information about actions of the circuit breaker phase selection opening and closing apparatus, and recorded fault information.

Furthermore, the remote communication signal, the remote measurement signal, the remote control signal and the relay protection action signal of the circuit breaker, as well as the information about actions of the circuit breaker phase selection opening and closing apparatus include information data acquired from a field measurement and control apparatus and the circuit breaker phase selection opening and closing apparatus of each of the substation and the converter station.

Furthermore, the relay protection action signal includes a protection action signal acquired from the relay protection apparatus and the relay protection information system.

Furthermore, the recorded fault information includes recorded fault information data acquired from the fault recording apparatus and a fault recording information system.

1.2 Circuit Breaker Opening and Closing Time Online Monitoring Module

Figure 3:
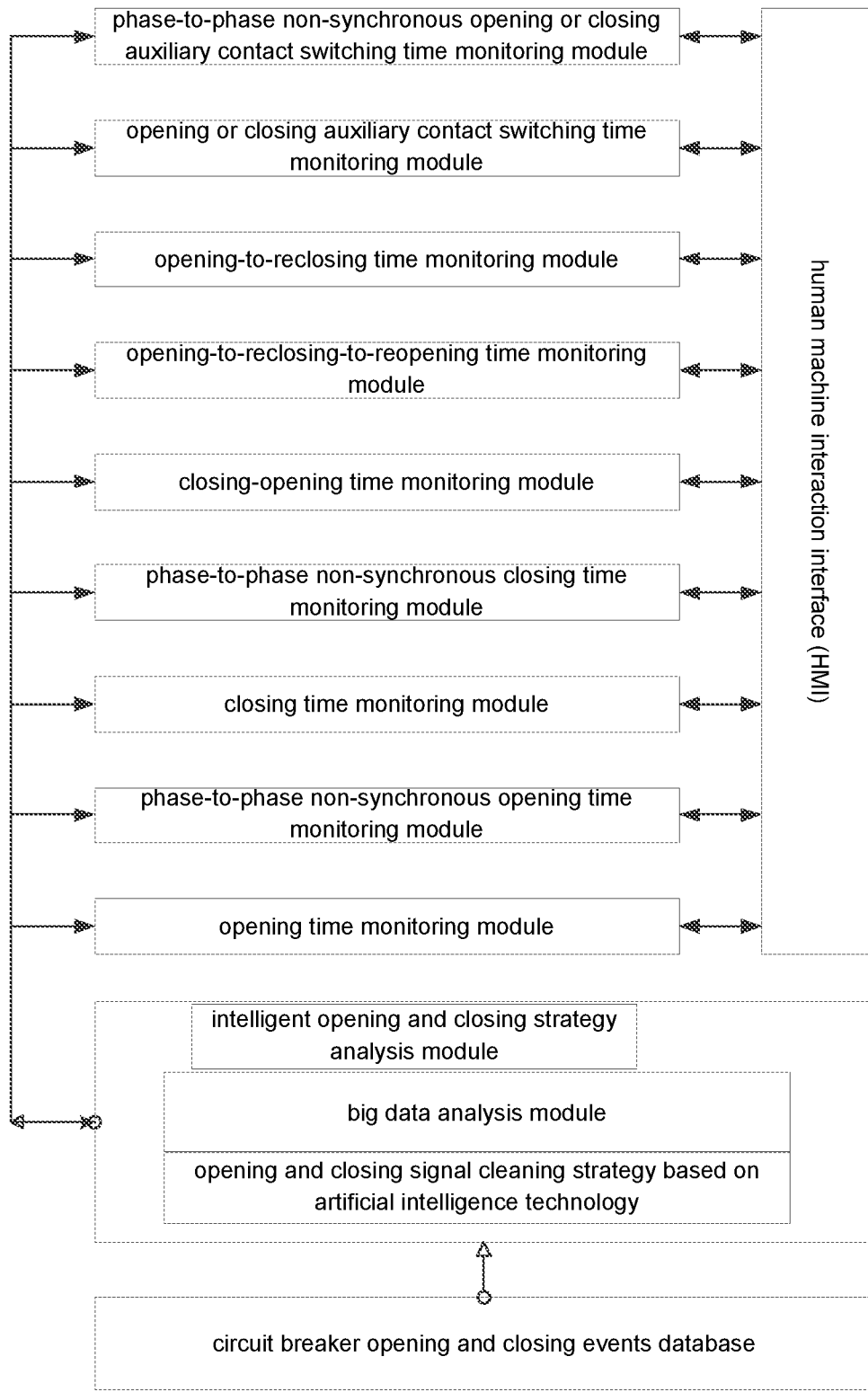
FIG. 3 is a schematic structural diagram of a high-voltage circuit breaker opening and closing time online monitoring module according to an embodiment of the invention.

With reference to FIG. 3, the circuit breaker opening and closing time online monitoring module is composed of an intelligent opening and closing strategy analysis module, an opening time monitoring module, a phase-to-phase non-synchronous opening time monitoring module, a closing time monitoring module, a phase-to-phase non-synchronous closing time monitoring module, a closing-opening time monitoring module, an opening-to-reclosing time monitoring module, an opening-to-reclosing-to-reopening time monitoring module, an opening or closing auxiliary contact switching time monitoring module, and a phase-to-phase non-synchronous opening or closing auxiliary contact switching time monitoring module.

The intelligent opening and closing strategy analysis module is composed of an opening and closing signal cleaning strategy and a big data analysis module, with the opening and closing signal cleaning strategy based on artificial intelligence technology. Opening and closing data of the circuit breaker, which is cleaned out by the intelligent opening and closing strategy analysis module, is input into the nine time monitoring modules described above, so that the time monitoring modules calculate out online monitoring results of nine time parameters.

1.3 Human Machine Interaction Interface (HMI)

The human machine interaction interface is used to allow a user to configure, manage, query and analyze the online monitoring results of a certain circuit breaker or circuit breaker cluster, and is mainly a program interface showing the above-mentioned nine time parameters and other statistical analysis results.

1.4 Data Quality and Accuracy

In the embodiment of the present invention, a comprehensive analysis is carried out by collecting real-time data, historical data and recorded fault data of the existing substation or converter station, so that the opening and closing time of the circuit breaker can be monitored online without causing power outage.

Obviously, in the embodiment of the invention, the accuracy of the monitoring of the opening and closing time of the circuit breaker is based on sampling accuracies of the measurement and control apparatus, the circuit breaker phase selection opening and closing apparatus, the relay protection apparatus and the fault recording apparatus, and resolution of switching value events is more than or equal to 0.1 ms and less than or equal to 1 ms.

2. Technical Models and Calculation Rules Included in the Embodiment of the Invention A method of implementing the embodiment of the present invention is performed by: extracting data related to opening and closing operations of a high-voltage circuit breaker, from opening or closing signal data and recorded fault data, the opening or closing signal data being sent by the measurement and control apparatus, the circuit breaker phase selection opening and closing apparatus, and the relay protection apparatus of the substation or converter station; constructing a circuit breaker opening and closing events database; and on this basis, performing, by utilizing big data, cloud computing and artificial intelligence technologies, deep analysis on the data related to the opening and closing operations of the circuit breaker, so as to obtain data about the opening and closing time characteristics of the circuit breaker.

2.1 Technical Models for Monitoring Opening and Closing Time of Circuit Breaker in the Embodiment of the Invention In the embodiment of the present invention, the opening time of the high-voltage circuit breaker refers to a total time required from a moment at which the circuit breaker receives a trip signal, for example, a moment at which a voltage is applied to a trip coil, to a moment at which the circuit breaker breaks so that three-phase arcs are completely extinguished, and the opening time is also called a rated break time or full opening time. The closing time of the high-voltage circuit breaker refers to a period of time required from a moment at which the circuit breaker receives a closing signal, for example, a moment at which a voltage is applied to a closing coil, to a moment at which three-phase main contacts of the circuit breaker are all in contact.

2.1.1 Technical Models for Opening and Closing Time of Circuit Breaker

In the embodiment of the present invention, as an opening or closing signal is taken from the measurement and control apparatus and the relay protection apparatus, and contact positions are taken from auxiliary contacts of an operating mechanism of the circuit breaker main body, the monitored opening or closing time in the embodiment of the present invention includes a period of time during which the opening or closing signal is transmitted in a circuit breaker opening and closing control circuit and a period of time during which the auxiliary contacts of the operating mechanism of the circuit breaker main body are put in place, that is:

$$T_{opening\ time} = T_{period\ of\ time\ during\ which\ the\ opening\ signal\ is\ transmitted\ in\ the\ circuit} + T_{period\ of\ time\ during\ which\ opening\ auxiliary\ contacts\ are\ put\ in\ place}$$

$$T_{closing\ time} = T_{period\ of\ time\ during\ which\ the\ closing\ signal\ is\ transmitted\ in\ the\ circuit} + T_{period\ of\ time\ during\ which\ closing\ auxiliary\ contacts\ are\ put\ in\ place}$$

It can be obtained from the above operation rules that, the high-voltage circuit breaker opening and closing time online monitoring apparatus provided in the embodiment of the present invention can also monitor the period of time during which the opening or closing signal is transmitted in the control circuit, and a change trend of the period of time indicates whether the control circuit is in a good state or not.

Based on monitored real-time timestamps of the opening or closing signal, the opening or closing time of a circuit breaker in which three phases are synchronously driven is calculated according to the following rules:

$$T_{opening\ time} = T_{moment\ at\ which\ opening\ auxiliary\ contacts\ are\ put\ in\ place} - T_{moment\ at\ which\ an\ opening\ command\ is\ issued} - k_{t\ compensation\ for\ opening}$$

$$T_{closing\ time} = T_{moment\ at\ which\ closing\ auxiliary\ contacts\ are\ put\ in\ place} - T_{moment\ at\ which\ a\ closing\ or\ reclosing\ command\ is\ issued} - k_{t\ compensation\ for\ closing}$$

The opening or closing time of a circuit breaker operated in single phase is calculated according to the following rules:

$$T_{single\text{-}phase\ opening\ time} = T_{moment\ at\ which\ opening\ auxiliary\ contacts\ for\ single\ phase\ are\ put\ in\ place} - T_{moment\ at\ which\ a\ single\text{-}phase\ opening\ command\ is\ issued} - k_{t\ compensation\ for\ opening}$$

$$T_{single\text{-}phase\ closing\ time} = T_{moment\ at\ which\ closing\ auxiliary\ contacts\ for\ single\ phase\ are\ put\ in\ place} - T_{moment\ at\ which\ a\ single\ phase\ closing\ or\ reclosing\ command\ is\ issued} - k_{t\ compensation\ for\ closing}$$

$k_{t\ compensation\ for\ opening}$ and $k_{t\ compensation\ for\ closing}$ mentioned above are dynamic time compensation values obtained by performing, based on big data and artificial intelligence technologies, mathematical operations on the circuit breaker opening or closing time monitored according to the embodiment of the invention, the circuit breaker opening or closing time in a power-outage preventive test, the circuit breaker opening or closing time in a handover test, and the period of time during which the opening or closing signal is transmitted in the control circuit.

2.1.2 Technical Model for Phases-to-Phase Non-Synchronous Opening or Closing Time of the Circuit Breaker The phase-to-phase non-synchronous opening or closing time of the circuit breaker refers to a difference between a maximum opening or closing time and a minimum opening or closing time of three phases A, B and C, and the smaller the value of the difference is, the better the synchronization is. The synchronization of opening or closing of the circuit breaker should satisfy the following condition: the phase-to-phase non-synchronous closing time is not more than 5 ms, and the phase-to-phase non-synchronous opening time is not more than 3 ms.

2.1.3 Technical Model for Closing-Opening Time of the Circuit Breaker

The closing-opening time generally refers to a period of time during which, in response to the circuit breaker getting closed due to a fault, an opening signal issued by the relay protection apparatus causes the circuit breaker to accelerate the opening and then break a fault current. The closing-opening time is an important parameter of the circuit breaker device, which reflects the mechanical properties of the circuit breaker, and the insulation strength and the arc extinguishing capability of an arc extinguishing chamber. The calculation rule of the closing-opening time is as follows:

$$T_{closing\text{-}opening\ time} = \\ T_{moment\ at\ which\ opening\ auxiliary\ contacts\ are\ put\ in\ place} - \\ T_{moment\ at\ which\ a\ closing\ or\ reclosing\ signal\ is\ issued} - \\ k_{t\ compensation\ for\ closing\text{-}opening}$$

$k_{t\ compensation\ for\ closing\text{-}opening}$ is a dynamic time compensation value obtained by performing, based on the big data and artificial intelligence technologies, mathematical operations on the circuit breaker opening or closing time monitored in the embodiment of the present invention, the circuit breaker opening or closing time in the power-outage preventive test, the circuit breaker opening or closing time in the handover test, and the period of time during which the opening or closing signal is transmitted in the control circuit.

2.1.4 Technical Model for Opening-to-Reclosing Time of Circuit Breaker

The opening-to-reclosing time refers to a period of time during which, in response to the circuit breaker getting opened due to a fault, a reclosing signal issued by the relay protection apparatus causes the circuit breaker to accelerate the closing and carry a load current. The calculation rule of the opening-to-reclosing time is as follows:

$$T_{opening\text{-}to\text{-}reclosing\ time} = \\ T_{moment\ at\ which\ closing\ auxiliary\ contacts\ are\ put\ in\ place} - \\ T_{moment\ at\ which\ an\ opening\ command\ signal\ is\ issued} - \\ k_{t\ compensation\ for\ opening\text{-}reclosing}$$

$kt_{compensation\ for\ opening\text{-}reclosing}$ is a dynamic time compensation value obtained by performing, based on the big data and artificial intelligence technologies, mathematical operations on the circuit breaker opening or closing time monitored according to the embodiment of the present invention, the circuit breaker opening or closing time in the power-outage preventive test, the circuit breaker opening or closing time in the handover test, and the period of time during which the opening or closing signal is transmitted in the control circuit.

2.1.5 Technical Model for Opening-to-Reclosing-to-Reopening Time of Circuit Breaker The opening-to-reclosing-to-reopening time refers to a period of time during which, in response to the circuit breaker getting opened due to a fault, the relay protection apparatus issues a trip signal, the circuit breaker breaks a fault current, a reclosing apparatus issues a reclosing signal so that the circuit breaker is closed and carries the fault current, and the relay protection apparatus issues the trip signal again so that the circuit breaker breaks the fault current. The calculation rule of the opening-to-reclosing-to-reopening time is as follows:

$$T_{opening\text{-}to\text{-}reclosing\text{-}to\text{-}reopening\ time} = \\ T_{moment\ at\ which\ opening\ auxiliary\ contacts\ are\ put\ in\ place\ for\ the\ second\ time} - \\ T_{moment\ at\ which\ the\ opening\ signal\ is\ firstly\ issued} - \\ k_{t\ compensation\ for\ opening\text{-}to\text{-}reclosing\text{-}to\text{-}reopening}$$

$k_{t\ compensation\ for\ opening\text{-}to\text{-}reclosing\text{-}to\text{-}reopening}$ is a dynamic time compensation value obtained by performing, based on the big data and artificial intelligence technologies, mathematical operations on the circuit breaker opening or closing time monitored according to the embodiment of the present invention, the circuit breaker opening or closing time in the power-outage preventive test, the circuit breaker opening or closing time in the handover test, and the period of time during which the opening or closing signal is transmitted in the control circuit.

2.1.6 Technical Model for Auxiliary Contact Switching Time of Circuit Breaker In general, auxiliary contacts of the circuit breaker are mechanically driven in synchronization with main contacts of primary devices, which truly reflect the running state of the main contacts of the primary devices, and are commonly used in an electrical control circuit for interlocking control of electric devices and used to provide switch value information for the relay protection apparatus and an automatic safety apparatus, and serve as a bridge between the primary devices and secondary devices. Therefore, the opening or closing state of the circuit breaker is introduced into the electrical control circuit through the mechanical auxiliary contacts, and the auxiliary contacts are closed or opened under the action of a mechanical force. Obviously, as the auxiliary contacts are related closely to the primary contacts, a trend of change in the opening or closing auxiliary contact switching time also reflects the period of time during which the primary main contacts are put in place for opening or closing.

During the actual operation of the circuit breaker, in the case of the opening of the circuit breaker, primary high-voltage main contacts of the circuit breaker are switched from a closed position to an open position, and secondary auxiliary contacts are synchronously switched from a closed position to an open position, and in this case, a calculation rule of the opening auxiliary contact switching time is as follows:

$$T_{opening\ auxiliary\ contact\ switching} = \\ T_{moment\ at\ which\ opening\ auxiliary\ contacts\ are\ closed} - \\ T_{moment\ at\ which\ closing\ auxiliary\ contacts\ are\ opened} - \\ k_{t\ compensation\ for\ opening\ auxiliary\ contacts\ switching}$$

In the case of the closing of the circuit breaker, the primary high-voltage main contacts of the circuit breaker are switched from the open position to the closed position, and the secondary auxiliary contacts are synchronously switched from the open position to the closed position, and in this case, a calculation rule of the closing auxiliary contact switching time is as follows:

$$T_{closing\ auxiliary\ contact\ switching} = \\ T_{moment\ at\ which\ closing\ auxiliary\ contacts\ are\ closed} - \\ T_{moment\ at\ which\ opening\ auxiliary\ contacts\ are\ opened} - \\ k_{t\ compensation\ for\ closing\ auxiliary\ contact\ switching}$$

$k_{t\ compensation\ for\ opening\ auxiliary\ contact\ switching}$ and $k_{t\ compensation\ for\ closing\ auxiliary\ contact\ switching}$ are dynamic time compensation values obtained by performing, based on the big data and artificial intelligence technologies, mathematical operations on the circuit breaker opening or closing time monitored according to the embodiment of the present invention, the circuit breaker opening or closing time in the power-outage preventive test, the circuit breaker opening or closing time in the handover test, and the period of time during which the opening or closing signal is transmitted in the control circuit.

2.1.7 Technical Model for Phase-to-Phase Non-Synchronization Opening or Closing Auxiliary Contact Switching Time of Circuit Breaker In the embodiment of the present invention, the phase-to-phase non-synchronous opening or closing auxiliary contact switching time of the circuit breaker is monitored and analyzed. The phase-to-phase non-synchronous opening or closing auxiliary contact switching time refers to a difference between a maximum switching time and a minimum switching time of the three phases A, B and C, and the smaller a value of the difference is, the better the synchronization is. The synchronization of the opening or closing auxiliary contact switching should satisfy the following condition: the phase-to-phase non-synchronous closing time is less than or equal to 5 ms, and the phase-to-phase non-synchronous opening time is less than or equal to 3 ms.

2.2 Effects of Dynamic Time Compensation Values $k_t$

A conventional integrated automation substation is greatly different from a digital substation and an intelligent substation in terms of the relay protection apparatus, the measurement and control apparatus, the circuit breaker phase selection opening and closing apparatus, the fault recording apparatus and the opening and closing control circuit and an alarm signal circuit. The technical models listed above in section 2.1 use the dynamic time compensation values kt to offset time delays of opening or closing signals corresponding to different physical links, thus making the online monitored results closer to the original manufacturing characteristics of the circuit breaker main body.

3. Method for Implementation of the Embodiment of the Invention

Figure 4:
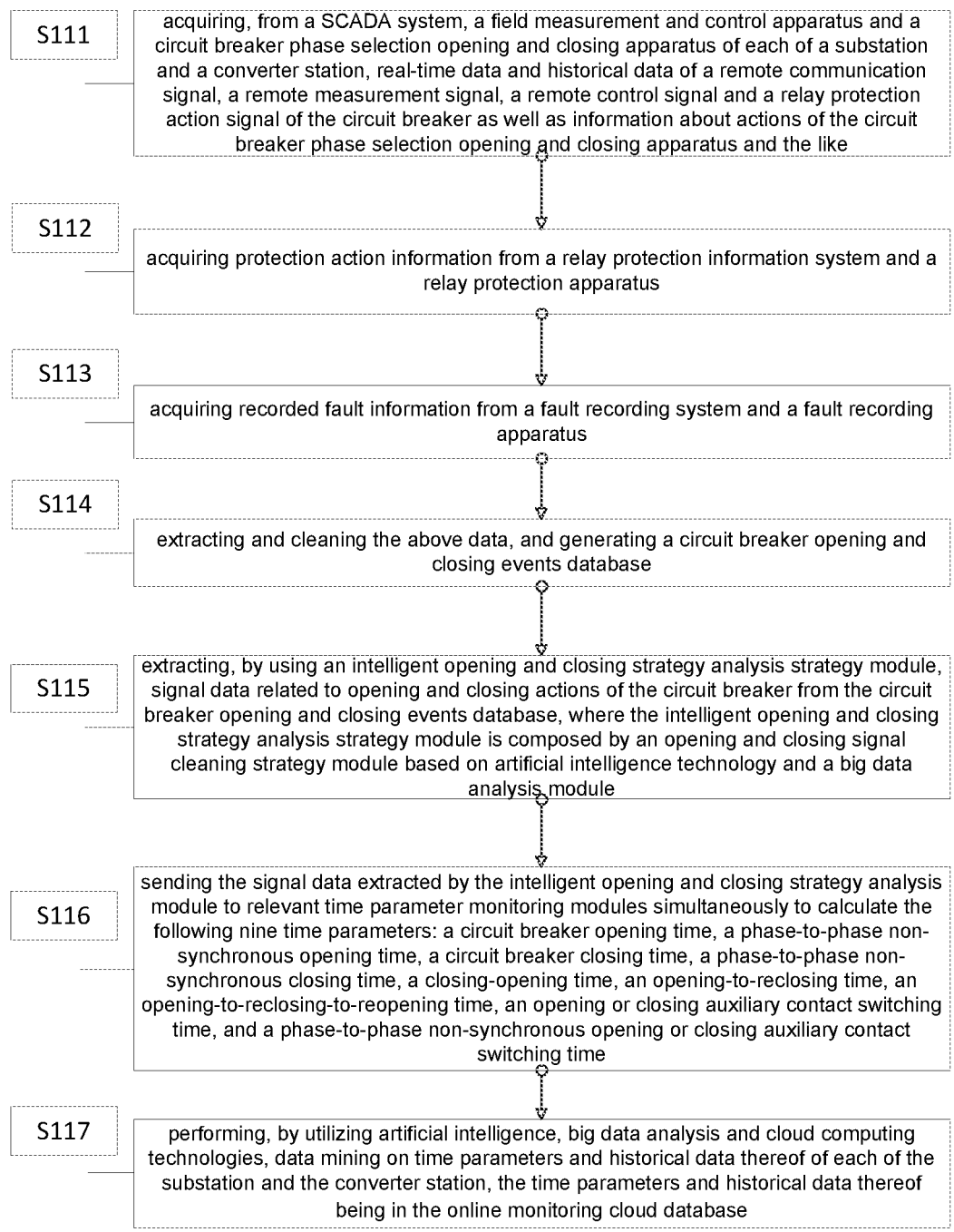
FIG. 4 is a flow chart of a method for online monitoring the opening and closing time of a high-voltage circuit breaker according to an embodiment of the present invention.

With reference to FIG. 4, the embodiment of the present invention also provides a method for online monitoring the circuit breaker opening and closing time using the apparatus and technique for online monitoring of the opening and closing time of a high-voltage circuit breaker mentioned above, and the method includes steps of:

S111: acquiring, from a SCADA system, a field measurement and control apparatus and a circuit breaker phase selection opening and closing apparatus of each of a substation and a converter station, real-time data and historical data of a remote communication signal, a remote measurement signal, a remote control signal and a relay protection action signal of the circuit breaker, as well as information about actions of the circuit breaker phase selection opening and closing apparatus, and the like;

S112: acquiring protection action information from a relay protection information system and a relay protection apparatus;

S113: acquiring recorded fault information from a fault recording system and a fault recording apparatus;

S114: extracting and cleaning the protection action information, the recorded fault information and the real-time data and historical data thereof, and generating a circuit breaker opening and closing events database;

S115: extracting, by using an intelligent opening and closing strategy analysis strategy module, signal data related to opening and closing actions of the circuit breaker from the circuit breaker opening and closing events database, where the intelligent opening and closing strategy analysis strategy module is composed by an opening and closing signal cleaning strategy module and a big data analysis module, with the opening and closing signal cleaning strategy module based on artificial intelligence technology;

S116: sending the signal data extracted by the intelligent opening and closing strategy analysis module to nine time monitoring modules simultaneously for comprehensive analysis as follows:

calculating, by an opening time monitoring module, a circuit breaker opening time;

calculating, by a phase-to-phase non-synchronous opening time monitoring module, a phase-to-phase non-synchronous opening time;

calculating, by a closing time monitoring module, a circuit breaker closing time;

calculating, by a phase-to-phase non-synchronous closing time monitoring module, a phase-to-phase non-synchronous closing time;

calculating, by a closing-opening time monitoring module, a closing-opening time;

calculating, by an opening-to-reclosing time monitoring module, an opening-to-reclosing time;

calculating, by an opening-to-reclosing-to-reopening time monitoring module, an opening-to-reclosing-to-reopening time;

calculating, by an opening or closing auxiliary contact switching time monitoring module, an opening or closing auxiliary contact switching time; and calculating, by a phase-to-phase non-synchronous opening or closing auxiliary contact switching time monitoring module, a phase-to-phase non-synchronous opening or closing auxiliary contact switching time;

S117: performing, by utilizing artificial intelligence, big data analysis and cloud computing technologies, data mining on time parameters and historical data thereof of each of the substation and the converter station to provide the following functions, the time parameters and historical data thereof being in the online monitoring cloud database:

a first function: comparing and ranking the time of manual opening or closing, and paying attention to a trend of historical change in the time of manual opening or closing;

a second function: comparing and ranking the opening or closing time, and paying attention to a trend of historical change in the phase-to-phase non-synchronous opening or closing time;

a third function: ranking a protective opening and reclosing time, and paying attention to a trend of historical change in the protective opening and reclosing time;

a fourth function: analyzing, for successful opening-to-reclosing and for the opening-to-reclosing-to-reopening, the circuit breaker control circuit and mechanical action characteristics of the circuit breaker main body, and paying attention to trends of historical changes in the circuit breaker control circuit and the mechanical action characteristics of the circuit breaker main body over time;

a fifth function: acquiring information about an operation command issued by the SCADA, information about the circuit breaker phase selection opening and closing apparatus, and a moment at which positions of auxiliary contacts of the circuit breaker are changed, and inspecting whether the circuit breaker phase selection opening and closing apparatus accurately responds to the operation command issued by the SCADA;

a sixth function: monitoring and calculating a period of time required from a moment at which an opening or closing signal is issued to a moment at which an opening or closing action of the circuit breaker is completed, and ranking the period of time in terms of change in length, so as to judge whether the opening and closing control circuit and the circuit breaker main body are in a good state;

a seventh function: performing, for a circuit breaker in which three phases are synchronously driven, a statistical analysis of a change trend of the closing-opening time of the circuit breaker; and performing, for a circuit breaker operated in single phase, a statistical analysis of a change trend of the closing-opening time for each of the three phases;

an eighth function: ranking the opening auxiliary contact switching time and the closing auxiliary contact switching time in terms of length, respectively, and paying attention to the trends of historical changes in the opening auxiliary contact switching time and the closing auxiliary contact switching time; and a ninth function: monitoring the opening time, the closing time, the phase-to-phase non-synchronous opening time, the phase-to-phase non-synchronous closing time and the phase-to-phase non-synchronous opening or closing auxiliary contact switching time, and sending a warning and incorporating the warning into a warning list if the opening time, the closing time, the phase-to-phase non-synchronous opening time, the phase-to-phase non-synchronous closing time or the phase-to-phase non-synchronous opening or closing auxiliary contact switching time exceeds a threshold value.

The above functions will be used to diagnose an abnormality of the operating mechanism of the circuit breaker main body, an abnormality of the control circuit, and an abnormality of the circuit breaker phase selection opening and closing apparatus.

By applying the model and method for online monitoring of the opening and closing time of a high-voltage circuit breaker according to the embodiments of the present invention, it is possible to achieve an accurate online monitoring of the opening and closing time of a high-voltage circuit breaker in a power grid, timely discover potential failures in mechanical structure and control circuit of the high-voltage circuit breaker, and provide a basis for active repair of high-voltage circuit breaker devices, thereby improving the safety and reliability of the high-voltage circuit breaker devices, improving the utilization of the high-voltage circuit breaker devices, reducing running and maintenance costs, and thus offering important value in safety and economy.

Figure 5:
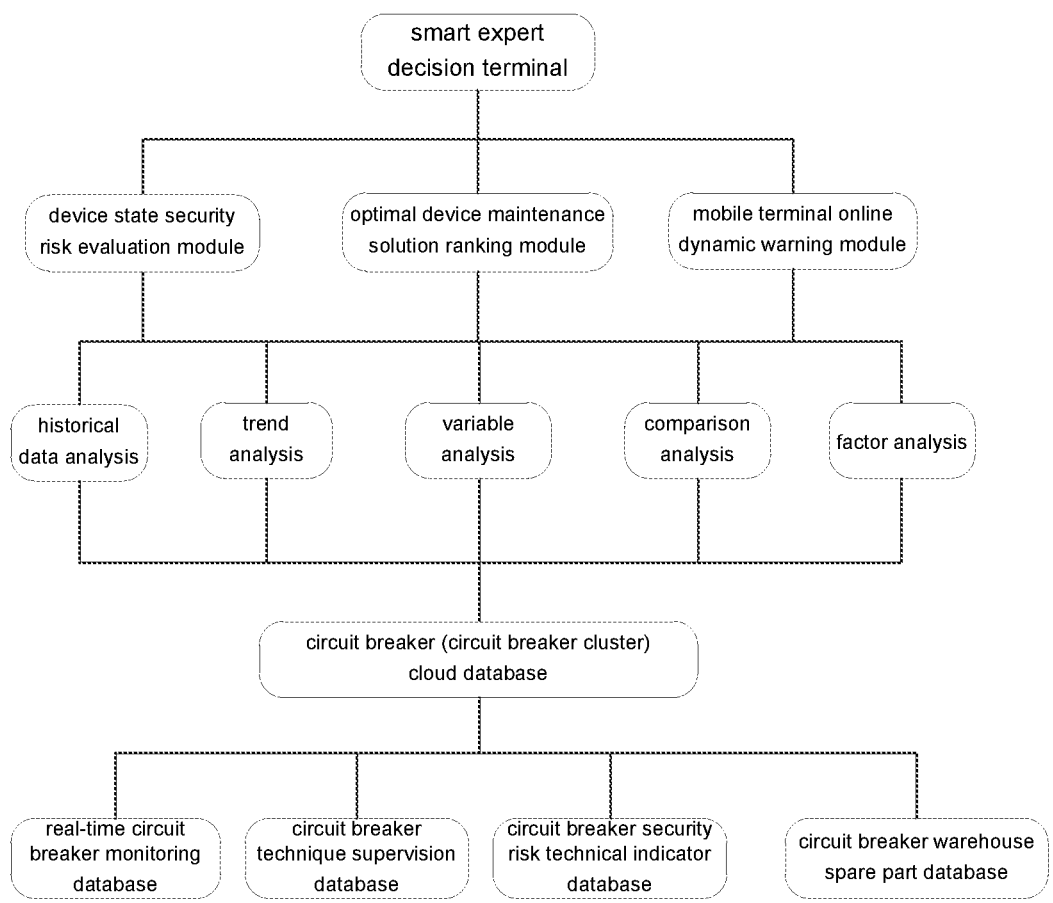
FIG. 5 is a structural diagram of a smart multi-dimensional big data analyzing expert system for a high-voltage circuit breaker in a power grid according to an embodiment of the present invention.

With reference to FIG. 5, on the above basis, the embodiments of the present invention also provide a smart multi-dimensional big data analyzing expert system for a high-voltage circuit breaker in a power grid. The smart multi-dimensional big data analyzing expert system for a high-voltage circuit breaker in a power grid includes the high-voltage circuit breaker opening and closing time online monitoring apparatus described above, and includes a circuit breaker cluster cloud database and a smart expert decision terminal. Data about opening and closing time characteristics of a high-voltage circuit breaker is obtained by online monitoring of the high-voltage circuit breaker opening and closing time online monitoring apparatus, and the data is derived from a measurement and control apparatus, a circuit breaker phase selection opening and closing apparatus, and a supervisory control and data acquisition system of each of a substation and a converter station; a relay protection apparatus and a relay protection information system; and a fault recording apparatus and a fault recording information system. The circuit breaker cluster cloud database includes a real-time circuit breaker monitoring database, a circuit breaker technique supervision database, a circuit breaker security risk technical indicator database and a circuit breaker warehouse spare part database. The smart expert decision terminal includes a device security risk evaluation module, an optimal device maintenance solution ranking module and a mobile terminal online dynamic warning module. The circuit breaker cluster cloud database dynamically acquires data, and the smart expert decision terminal performs history data analysis, trend analysis, variable analysis, comparison analysis and factor analysis on the acquired data.

Furthermore, the real-time circuit breaker monitoring database includes a working voltage, a working current, states of opening and closing coils, positions of three-phase contacts, a counter for opening and closing actions, the state of an operating mechanism, a counter for actions of applying a voltage to a motor, the pressure of SF6 gas, the position of an isolation switch, and the position of a grounded knife switch, which are acquired from a substation automation system and a field measurement and control apparatus.

Furthermore, action processes and breaking current values of the circuit breaker, which are in a circuit breaker protection apparatus, a line protection apparatus and a relevant-element (e.g., a main transformer, a bus, a reactor and a capacitor) protection apparatus, are acquired from a relay protection apparatus and a relay protection management information system of the substation.

Furthermore, a fault recording apparatus is further included, and a value of a fault current broken by the circuit breaker and an action process of the three-phase contacts are acquired from the fault recording apparatus.

Furthermore, inherent design parameters of the circuit breaker are further included, and the inherent design parameters include waveforms of opening and closing operations, opening and closing speeds, opening and closing time, overtravel, opening range, bounce, voltage and current of opening and closing coils, as well as an action time and power of an iron core.

Figure 10:
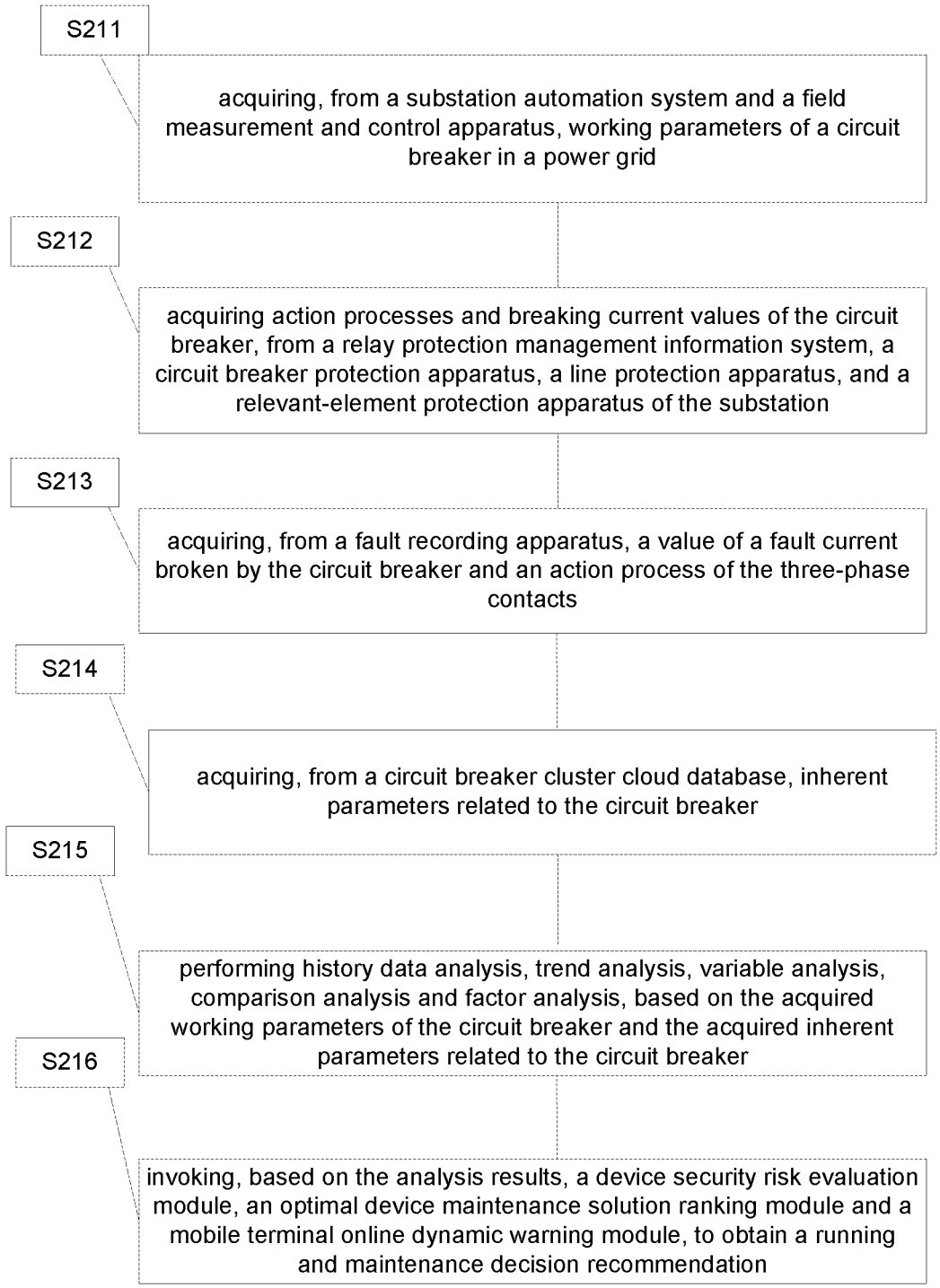
FIG. 10 is a flow chart of a method of monitoring a circuit breaker using a smart multi-dimensional big data analyzing expert system for a high-voltage circuit breaker in a power grid according to an embodiment of the present invention.

With reference to FIG. 10, the embodiments of the present invention also provide a method of monitoring a circuit breaker using the previously mentioned smart multi-dimensional big data analyzing expert system for a high-voltage circuit breaker in a power grid, and the method includes the following steps:

step S211: obtaining, by the high-voltage circuit breaker opening and closing time online monitoring apparatus described above, online-monitored data about opening and closing time characteristics of a high-voltage circuit breaker, and acquiring, from a substation automation system and a field measurement and control apparatus, working parameters of a circuit breaker in a power grid, where the working parameters include a working voltage and a working current of the circuit breaker, states of opening and closing coils, positions of three-phase contacts, a counter for opening and closing actions, a state of an operating mechanism, a counter for actions of applying a voltage to a motor, a pressure of SF6 gas, a position of an isolation switch, and a position of a grounded knife switch;

step S212: acquiring action processes and breaking current values of the circuit breaker, from a relay protection management information system, a circuit breaker protection apparatus, a line protection apparatus, and a relevant-element protection apparatus of the substation;

step S213: acquiring, from a fault recording apparatus, a value of a fault current broken by the circuit breaker and an action process of the three-phase contacts;

step S214: acquiring, from a circuit breaker cluster cloud database, inherent parameters related to the circuit breaker, where the inherent parameters include national technical standards for circuit breakers, design parameters of manufacturers of circuit breakers, debugging and acceptance parameters, device defect records, device reliability statistics, action characteristic inspection, power-outage preventive test and SF6 gas inspection;

step S215: performing history data analysis, trend analysis, variable analysis, comparison analysis and factor analysis, based on the acquired working parameters of the circuit breaker and the acquired inherent parameters related to the circuit breaker; and step S216: invoking, based on the analysis results, a device security risk evaluation module, an optimal device maintenance solution ranking module and a mobile terminal online dynamic warning module, to obtain a running and maintenance decision recommendation.

Furthermore, the circuit breaker cluster cloud database includes a real-time circuit breaker monitoring database for providing real-time working parameters of the circuit breaker, a circuit breaker technique supervision database for providing inherent parameters of the circuit breaker, a circuit breaker security risk technical indicator database for providing security risk technical indicators of the circuit breaker, and a circuit breaker warehouse spare part database for providing specification data of the circuit breaker.

Furthermore, data in the circuit breaker technique supervision database for providing inherent parameters of the circuit breaker includes: waveforms of opening and closing operations, opening and closing speeds, opening and closing time, overtravel, opening range, bounce, voltage and current of opening and closing coils, as well as an action time and power of an iron core.

Furthermore, the circuit breaker security risk technical indicator database for providing security risk technical indicators of the circuit breaker includes a power grid system risk database, a circuit breaker ontological risk database, and an inspection and repair task risk database.

Furthermore, data in the circuit breaker warehouse spare part database for providing specification data of the circuit breaker include specification parameters, with the specification parameters including: the brand of a main device; and names, specifications and model numbers of spare parts, and so on.

The smart multi-dimensional big data analyzing expert system for a high-voltage circuit breaker in a power grid provided in the embodiments of the present invention removes the isolation of information on the high-voltage circuit breaker in eight areas, with the eight area including a substation automation system, a relay protection management information system, a fault recording management system, an online monitoring system, a warehouse spare part management system, a preventive test technique supervision and management system, a running and maintenance management system, and an original device supervising manufacture and detection monitoring system, and the expert system is a system for providing, based on wide area information technology, online monitoring and dynamic evaluation as well as warning and management control to a circuit breaker device. The system is composed of two parts, which are a high-voltage circuit breaker cluster cloud database and a smart expert decision terminal. The data extracted from the high-voltage circuit breaker cluster cloud database is derived from integrated data about the running of the circuit breaker or the circuit breaker cluster (hereinafter collectively referred to as the circuit breaker). The smart expert decision terminal includes a device security risk evaluation module, an optimal device maintenance solution ranking module and a mobile terminal online dynamic warning module, which are provided on the basis of the functions of multi-dimensional smart analysis, such as history data analysis, trend analysis, variable analysis, comparison analysis and factor analysis.

1) The circuit breaker cluster cloud database is composed of four parts, which are a real-time circuit breaker monitoring database, a circuit breaker technique supervision database, a circuit breaker security risk indicator database, and a circuit breaker warehouse spare part database.

Figure 6:
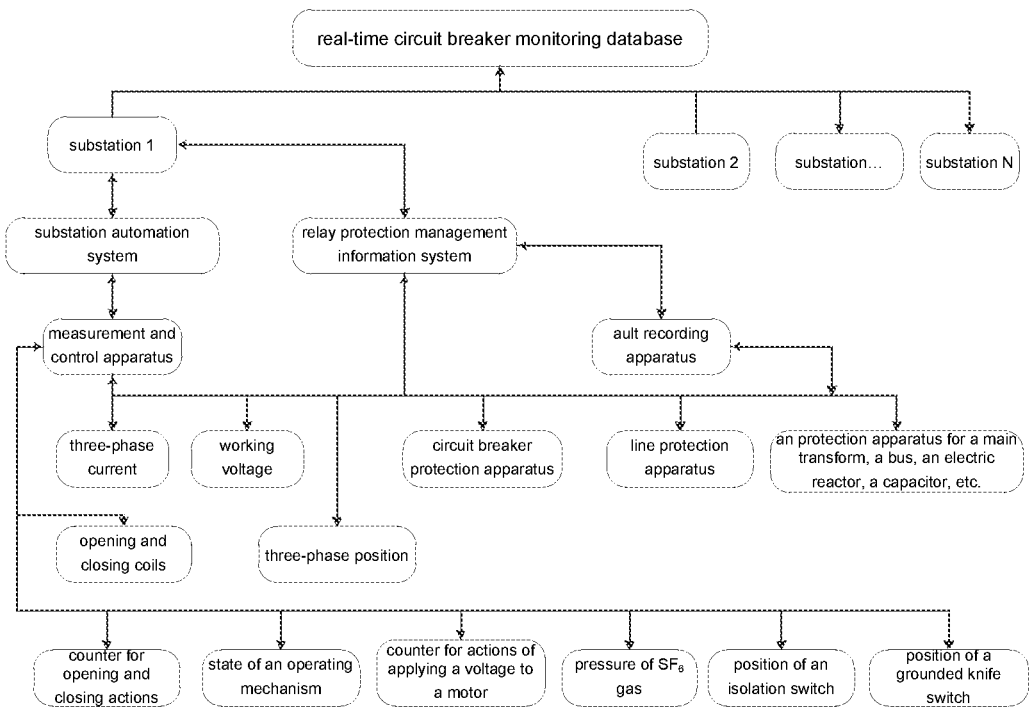
FIG. 6 is a schematic diagram of a real-time circuit breaker monitoring database according to an embodiment of the present invention.

1.1) Real-Time Circuit Breaker Monitoring Database:

With reference to FIG. 6, the real-time circuit breaker monitoring database acquires, from a substation automation system and a field measurement and control apparatus, a working voltage and a working current of a circuit breaker device, states of opening and closing coils, the position of three-phase contacts, a counter for opening and closing actions, the state of an operating mechanism, a counter for actions of applying a voltage to a motor, the pressure of SF6 gas, the position of an isolation switch, and the position of a grounded knife switch.

It acquires, from a relay protection management information system of the substation, action processes and breaking current values of the circuit breaker, which are in a circuit breaker protection apparatus, a line protection apparatus and a relevant-element (e.g., a main transformer, a bus, a reactive and a capacitor) protection apparatus.

It acquires, from a fault recording apparatus, a value of a fault current broken by the circuit breaker and an action process of the three-phase contacts.

In the above process, a circuit breaker cluster cloud database composed of different substations, different brands, and different model numbers may be defined as required.

Figure 7:
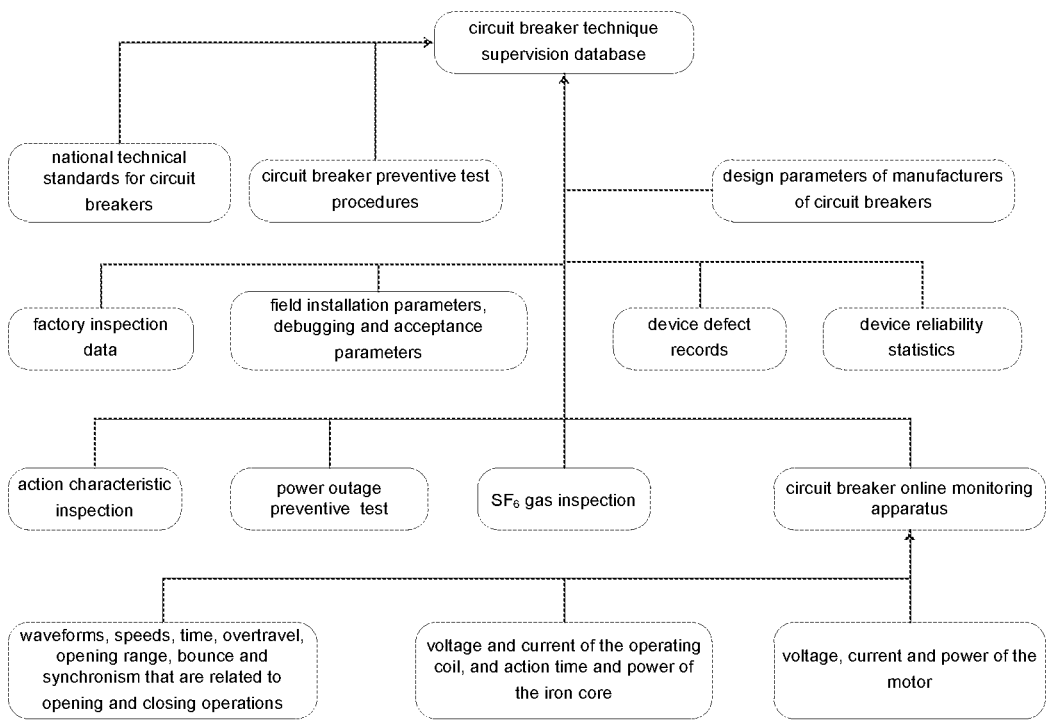
FIG. 7 is a schematic diagram of a circuit breaker technique supervision database according to an embodiment of the present invention.

1.2) Circuit Breaker Technique Supervision Database:

With reference to FIG. 7, the circuit breaker technique supervision database includes national technical standards for circuit breakers, circuit breaker preventive test procedures, design parameters of manufacturers of circuit breakers, as well as factory inspection data, field installation parameters, debugging and acceptance parameters, device defect records, and device reliability statistics, and further includes action characteristic inspection, power-outage preventive test, and SF6 gas inspection.

The circuit breaker technique supervision database also includes data acquired from a circuit breaker online monitoring apparatus provided specially for online monitoring of the circuit breaker, such data may be: for example, waveforms of opening and closing operations, opening and closing speeds, opening and closing time, overtravel, opening range, bounce and synchronism of the operating mechanism; the voltage and current of the opening and closing coils, and the action time and power of the iron core; and the voltage, current and power of the motor.

Figure 8:
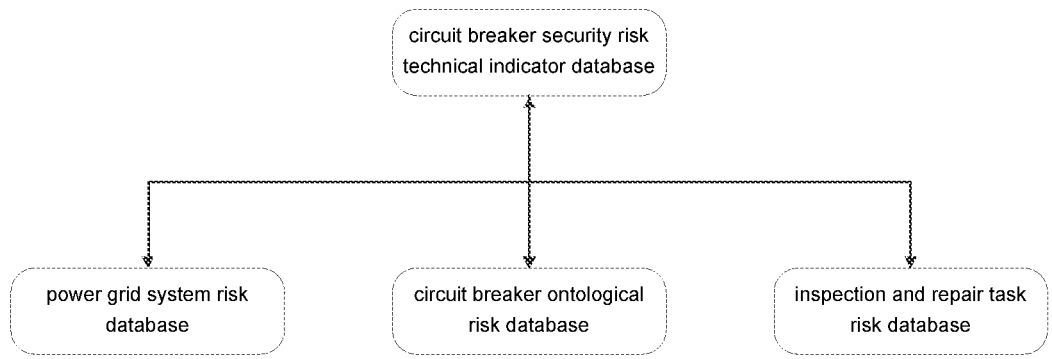
FIG. 8 is a schematic diagram of a circuit breaker security risk technical indicator database according to an embodiment of the present invention.

1.3) Circuit Breaker Security Risk Technical Indicator Database:

With reference to FIG. 8, the circuit breaker security risk technical indicator database includes a power grid system risk database, a circuit breaker ontological risk database, and an inspection and repair task risk database.

Figure 9:
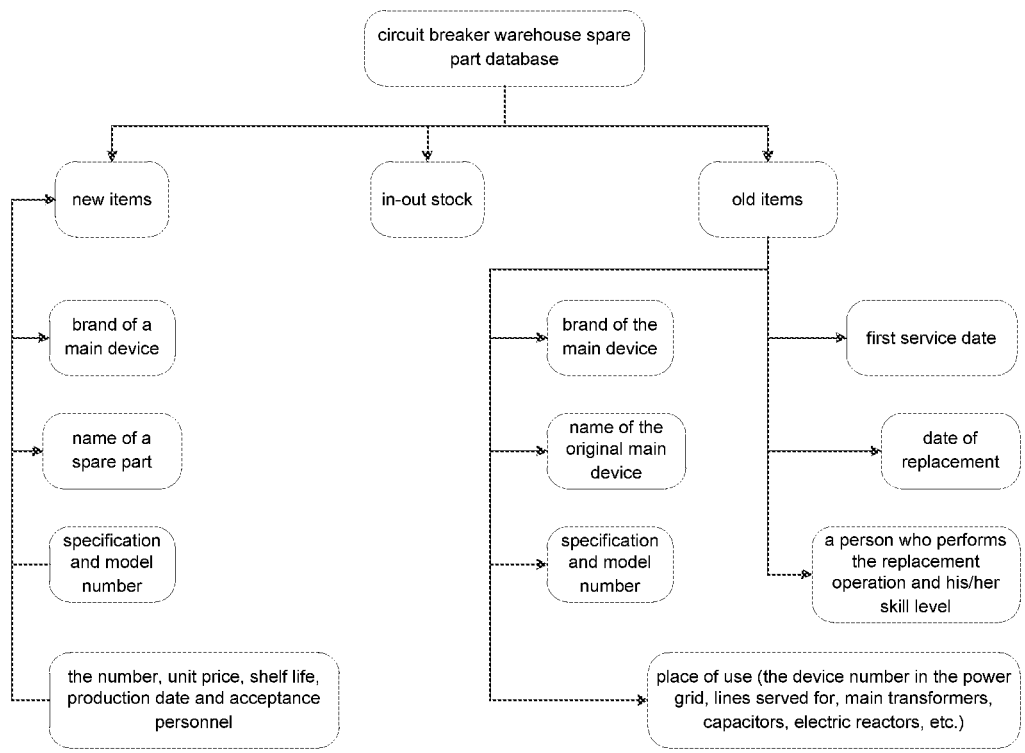
FIG. 9 is a schematic diagram of a circuit breaker warehouse spare part database according to an embodiment of the present invention.

1.4) Circuit Breaker Warehouse Spare Part Database:

With reference to FIG. 9, the circuit breaker warehouse spare parts database includes new items, old items and in-out stock. The contents of the new items include: the brand of a main device; and the name, specification and model number, the number, unit price, shelf life, production date, and acceptance personnel of a spare part. The contents of the old items include: the brand of the main device; the name, specification, model number, place of use (the device number in the power grid, lines served for, main transformers, capacitors, electric reactors, etc.), the first service date, and the date of replacement; and a person who performs the replacement operation and his/her skill level.

2) Functions of the Smart Expert Decision Terminal:

The acquisition of the cloud data of the circuit breaker cluster is carried out dynamically, and is carried out based on the invoking of history data analysis, trend analysis, variable analysis, comparison analysis and factor analysis functions possessed by the smart expert decision terminal.

The smart expert decision terminal provides the following functions:

The following analysis and decision-making functions are provided in the framework of a smart strategy.

The first function: a circuit breaker with the highest breaking current may be obtained through ranking, and the attention is focused on the monitoring of this circuit breaker's electrical and mechanical characteristics, and is paid to comparison between data of a power-outage preventive test of this circuit breaker and historical data.

The second function: a circuit breaker with the highest number of actions may be obtained through ranking, the attention is paid to this circuit breaker's electrical and mechanical characteristics, and at the same time, a suggestion is put forward that the operation order should be arranged reasonably (for example, the numbers of operations of circuit breakers for switching a capacitor bank should be equalized), and the smart terminal can be combined directly with a remote control system to achieve an automatic operation of the circuit breaker.

The third function: a circuit breaker with the greatest number of inspections and repairs during power outage may be obtained through ranking, the attention is paid to the type, name and model number of the spare part replacing this circuit breaker, and to the skill level of a person who performs the replacement operation and the upgrading thereof, and the main influence factors are analyzed and improvement is made accordingly.

The fourth function: a circuit breaker with the longest inspection and repair time during power outage may be screened out, the attention is paid to the rationality of the inspection and repair scheme, and the main influence factors are analyzed and improvement is made accordingly.

The fifth function: a circuit breaker with the highest cost of inspection and repair is screened out, and the attention is paid to the rationality of the inspection and repair scheme.

The sixth function: big data analysis is performed on historical data of the circuit breakers in accordance with the brand, model number and batch, to find out trends of changes in electrical characteristics, mechanical characteristics, and SF6 insulation characteristics of each circuit breaker or circuit breaker cluster, and an arrangement of inspection and repair works is checked based on the trends, to find unsafe hazards and signs therefrom.

The seventh function: online big data analysis is performed, based on wide area information technology, on the speeds of opening and closing operations of the circuit breaker, the opening and closing time and the coordination of actions of the operating mechanism, to identify major potential hazards with mechanical failures, give an operational warning to the device having a potential security hazard, and even stop the operation of the circuit breaker having a major potential hazard.

The eighth function: evaluation and analysis are performed on the risks that the circuit breaker brings to the power grid, devices and tasks, and risk control measures are put forward, these measures including contents such as supplier and contractor management, security technology, prevention and correction, emergency and accident management, and production management.

The ninth function: a mobile warning signal is sent, based on the result of the multi-dimensional big data analysis, to a security technical manager, and the manager can access relevant information through a terminal such as a tablet computer, a hand phone and a notebook computer.

The tenth function: targeted improvements of structural designs, qualities of spare parts, skill training of repairers and the like are provided by the manufacturers of circuit breakers according to the analysis results of the above functions, to further enhance the improvement effect of the above functions, so as to improve the running and maintenance of the circuit breakers as well as the safe and economic running level of the circuit breakers.

The smart multi-dimensional big data analyzing expert system for a circuit breaker in a power grid is implemented by the following steps.

Step 1: acquiring data from a real-time monitoring database.

A working voltage and a working current of a circuit breaker device, states of opening and closing coils, the positions of three-phase contacts, a counter for opening and closing actions, the state of an operating mechanism, a counter for actions of applying a voltage to a motor, the pressure of SF6 gas, the position of an isolation switch, and the position of a grounded knife switch are mainly acquired from a substation automation system and a field measurement and control apparatus.

Step 2: acquiring data from a circuit breaker technique supervision database.

The circuit breaker technique supervision database includes national technical standards for circuit breakers, circuit breaker preventive test procedures, design parameters of manufacturers of circuit breakers, as well as factory inspection data, field installation parameters, debugging and acceptance parameters, device defect records, and device reliability statistics, and further includes action characteristic inspection, power-outage preventive test, and SF6 gas inspection.

The circuit breaker technique supervision database also includes data acquired from a circuit breaker online monitoring apparatus provided specially for online monitoring of the circuit breaker, such data may be: for example, waveforms of opening and closing operations, opening and closing speeds, opening and closing time, overtravel, opening range, bounce and synchronism of the operating mechanism; the voltage and current of the opening and closing coils, and the action time and power of the iron core; and the voltage, current and power of the motor.

Step 3: acquiring data from a circuit breaker security risk technical indicator database.

The circuit breaker security risk technical indicator database includes a power grid system risk database, a circuit breaker ontological risk database, and an inspection and repair task risk database.

Step 4: acquiring data from a circuit breaker warehouse spare part database.

The circuit breaker warehouse spare part database mainly includes new items, old items and in-out stock management. The contents of the new items include: the brand of a main device; and the name, specification and model number, the number, unit price, shelf life, production date, and acceptance personnel of a spare part. The contents of the old items include: the brand of the main device; the name, specification, model number, place of use (the device number in the power grid, lines served for, main transformers, capacitors, electric reactors, etc.), the first service date, and the date of replacement; and a person who performs the replacement operation and his/her skill level.

The data in the above database have the highest data quality in the power system, and are very critical to ensuring the accuracy of the smart big data analysis.

Step 5: analyzing the above four kinds of data by using history data analysis, trend analysis, variable analysis, comparison analysis and factor analysis, respectively.

Step 6: invoking a device security risk evaluation module, an optimal device maintenance solution ranking module, and a mobile terminal online dynamic warning module as required, to obtain a running and maintenance decision recommendation. After the decision recommendation or the smart strategy is gradually optimized and perfected, the system of the present invention can also interface with a remote control system to dynamically control the circuit breaker.

Based on the smart multi-dimensional big data analysis according to the above solution of the present invention, a running and maintenance strategy, such as continuation of running, stop of the running, or an inspection and repair plan, is proposed, so as to carry out the full life cycle management of the circuit breaker in the power system, to achieve the objective of the scientific and economic running and maintenance as well as the improvement of the security level.

The embodiments of the present invention described above are not to be construed as limiting the scope of the invention. Any modifications, equivalent alternatives, improvements and so on, made within the spirit and principle of the present invention, are to be embraced in the scope of protection of the present invention.

INDUSTRIAL APPLICABILITY

The apparatus and method for online monitoring of the opening and closing time of a high-voltage circuit breaker provided in the embodiments of the present invention can enable online monitoring of the opening and closing time characteristics of a high-voltage circuit breaker, without adding any sensors or intelligent electronic devices (IEDs), and without performing installation and debugging during power outage. The smart multi-dimensional big data analyzing expert system for a high-voltage circuit breaker in a power grid and a method therefor can enable online monitoring of a variety of data about a high-voltage circuit breaker, and are applicable to high voltage circuit breakers with various voltage levels and various operating mechanisms and to GIS, HGIS, and AIS high-voltage switchgears. In the embodiments of the present invention, High-quality data are extracted separately from an automation system, a measurement and control apparatus, a circuit breaker phase selection opening and closing apparatus, a relay protection apparatus, a relay protection management information system, a fault recording apparatus, and various cloud databases such as a technical supervision database and a warehouse spare part database, and unique processional databases are created for circuit breaker elements, so as to lay the foundation for smart analysis.

The invention claimed is:

1. A high-voltage circuit breaker opening and closing time online monitoring apparatus, comprising a circuit breaker opening and closing events database, a circuit breaker opening and closing time online monitoring module and a human machine interaction interface, wherein the circuit breaker opening and closing events database comprises: a remote communication signal, a remote measurement signal, a remote control signal and a relay protection action signal of the circuit breaker, as well as information about actions of the circuit breaker phase selection opening and closing apparatus, and recorded fault information;

the remote communication signal, the remote measurement signal, the remote control signal and the relay protection action signal of the circuit breaker, as well as the information about actions of the circuit breaker phase selection opening and closing apparatus comprise information data acquired from a field measurement and control apparatus and the circuit breaker phase selection opening and closing apparatus of each of the substation and the converter station; the relay protection action signal comprises a protection action signal acquired from the relay protection apparatus and the relay protection information system; and the recorded fault information comprises recorded fault information data acquired from the fault recording apparatus and the fault recording information system;

the circuit breaker opening and closing time online monitoring module is composed of nine time monitoring modules, with the nine time monitoring modules comprising an intelligent opening and closing strategy analysis module, an opening time monitoring module, a phase-to-phase non-synchronous opening time monitoring module, a closing time monitoring module, a phase-to-phase non-synchronous closing time monitoring module, a closing-opening time monitoring module, an opening-to-reclosing time monitoring module, an opening-to-reclosing-to-reopening time monitoring module, an opening or closing auxiliary contact switching time monitoring module, and a phase-to-phase non-synchronous opening or closing auxiliary contact switching time monitoring module;

the human machine interaction interface is configured to allow a user to configure, manage, query and analyze the online monitoring results of a certain circuit breaker or circuit breaker cluster, and is a program interface showing the nine time parameters and other statistical analysis results;

wherein data about opening and closing time characteristics of a high-voltage circuit breaker is obtained by online monitoring of the online monitoring apparatus, and the data is derived from a measurement and control apparatus, a circuit breaker phase selection opening and closing apparatus and a supervisory control and data acquisition system of each of a substation and a converter station; a relay protection apparatus and a relay protection information system;

and a fault recording apparatus and a fault recording information system, and wherein the monitoring apparatus provides real-time monitored data and historical data about a power grid, with the real-time monitored data and historical data for performing the online monitoring of the opening and closing time of the circuit breaker.

2. The high-voltage circuit breaker opening and closing time online monitoring apparatus according to claim 1, wherein opening time of the high-voltage circuit breaker refers to a total time required from a moment at which the circuit breaker receives a trip signal to a moment at which the circuit breaker breaks so that three-phase arcs are completely extinguished; closing time of the high-voltage circuit breaker refers to a period of time required from a moment at which the circuit breaker receives a closing signal to a moment at which three-phase main contacts of the circuit breaker are all in contact; and auxiliary contacts driven in synchronization with primary main contacts are taken as reference for opening and closing positions of the circuit breaker.

3. The high-voltage circuit breaker opening and closing time online monitoring apparatus according to claim 1, wherein the online monitoring apparatus is installed at different sites, and high-voltage circuit breaker opening and closing time online monitoring cloud databases at different hierarchies are created through power-dedicated network connection, so as to enable the online monitoring based on big data, cloud computing and artificial intelligence technologies.

4. The high-voltage circuit breaker opening and closing time online monitoring apparatus according to claim 1, wherein the intelligent opening and closing strategy analysis module is composed of an opening and closing signal cleaning strategy and a big data analysis module, with the opening and closing signal cleaning strategy based on artificial intelligence technology; opening and closing data of the circuit breaker, which is cleaned out by the intelligent opening and closing strategy analysis module, is input into the nine time monitoring modules, so that the nine time monitoring modules calculate out online monitoring results of nine time parameters.

5. The high-voltage circuit breaker opening and closing time online monitoring apparatus according to claim 1, wherein technical models and operation rules for monitoring the opening and closing time of the circuit breaker are as follows:

an opening or closing signal is acquired from the measurement and control apparatus and the relay protection apparatus, contact positions are determined based on auxiliary contacts of an operating mechanism of the circuit breaker main body, and the monitored opening or closing time comprises a period of time during which the opening or closing signal is transmitted in a circuit breaker opening and closing control circuit and a period of time during which the auxiliary contacts of the operating mechanism of the circuit breaker main body are put in place;

$$T_{opening\ time} = T_{period\ of\ time\ during\ which\ the\ opening\ signal\ is\ transmitted\ in\ the\ circuit} + T_{period\ of\ time\ during\ which\ opening\ auxiliary\ contacts\ are\ put\ in\ place}$$

$$T_{closing\ time} = T_{period\ of\ time\ during\ which\ the\ closing\ signal\ is\ transmitted\ in\ the\ circuit} + T_{period\ of\ time\ during\ which\ closing\ auxiliary\ contacts\ are\ put\ in\ place}$$

based on monitored real-time timestamps of the opening or closing signal, the opening or closing time of a circuit breaker in which three phases are synchronously driven is calculated according to the following rules:

$$T_{opening\ time} = T_{moment\ at\ which\ opening\ auxiliary\ contacts\ are\ put\ in\ place} - T_{moment\ at\ which\ an\ opening\ command\ is\ issued} - k_{t\ compensation\ for\ opening}$$

$$T_{closing\ time} = T_{moment\ at\ which\ closing\ auxiliary\ contacts\ are\ put\ in\ place} - T_{moment\ at\ which\ a\ closing\ or\ reclosing\ command\ is\ issued} - k_{t\ compensation\ for\ closing}$$

the opening or closing time of a circuit breaker operated in single phase is calculated according to following rules:

$$T_{single\text{-}phase\ opening\ time} = T_{moment\ at\ which\ opening\ auxiliary\ contacts\ for\ single\ phase\ are\ put\ in\ place} - T_{moment\ at\ which\ a\ single\text{-}phase\ opening\ command\ is\ issued} - k_{t\ compensation\ for\ opening}$$

$$T_{single\text{-}phase\ closing\ time} = T_{moment\ at\ which\ closing\ auxiliary\ contacts\ for\ single\ phase\ are\ put\ in\ place} - T_{moment\ at\ which\ a\ single\ phase\ closing\ or\ reclosing\ command\ is\ issued} - k_{t\ compensation\ for\ closing}$$

wherein $k_{t\ compensation\ for\ opening}$ and $k_{t\ compensation\ for\ closing}$ are dynamic time compensation values obtained by performing, based on big data and artificial intelligence technologies, mathematical operations on the monitored circuit breaker opening or closing time, the circuit breaker opening or closing time in a power-outage preventive test, the circuit breaker opening or closing time in a handover test, and the period of time during which the opening or closing signal is transmitted in the control circuit;

the phase-to-phase non-synchronous opening or closing time of the circuit breaker refers to a difference between a maximum opening or closing time and a minimum opening or closing time of three phases A, B and C, and the smaller a value of the difference is, the better the synchronization is; the synchronization of opening or closing of the circuit breaker satisfies the following condition: the phase-to-phase non-synchronous closing time is not more than 5 ms, and the phase-to-phase non-synchronous opening time is not more than 3 ms;

the closing-opening time refers to a period of time during which, in response to the circuit breaker getting closed due to a fault, an opening signal issued by the relay protection apparatus causes the circuit breaker to accelerate the opening and then break a fault current; and a calculation rule of the closing-opening time is as follows:

$$T_{closing\text{-}opening\ time} = T_{moment\ at\ which\ opening\ auxiliary\ contacts\ are\ put\ in\ place} - T_{moment\ at\ which\ a\ closing\ or\ reclosing\ signal\ is\ issued} - k_{t\ compensation\ for\ closing\text{-}opening}$$

wherein $k_{t\ compensation\ for\ closing\text{-}opening}$ is a dynamic time compensation value obtained by performing, based on the big data and artificial intelligence technologies, mathematical operations on the monitored circuit breaker opening or closing time, the circuit breaker opening or closing time in the power-outage preventive test, the circuit breaker opening or closing time in the handover test, and the period of time during which the opening or closing signal is transmitted in the control circuit;

the opening-to-reclosing time refers to a period of time during which, in response to the circuit breaker getting opened due to a fault, a reclosing signal issued by the relay protection apparatus causes the circuit breaker to accelerate the closing and carry a load current; and a calculation rule of the opening-to-reclosing time is as follows:

$$T_{opening\text{-}to\text{-}reclosing\ time} = \\ T_{moment\ at\ which\ closing\ auxiliary\ contacts\ are\ put\ in\ place} - \\ T_{moment\ at\ which\ an\ opening\ command\ signal\ is\ issued} - \\ k_{t\ compensation\ for\ opening\text{-}reclosing}$$

wherein $k_{t\ compensation\ for\ opening\text{-}reclosing}$ is a dynamic time compensation value obtained by performing, based on the big data and artificial intelligence technologies, mathematical operations on the monitored circuit breaker opening or closing time, the circuit breaker opening or closing time in the power-outage preventive test, the circuit breaker opening or closing time in the handover test, and the period of time during which the opening or closing signal is transmitted in the control circuit;

the opening-to-reclosing-to-reopening time refers to a period of time during which, in response to the circuit breaker getting opened due to a fault, the relay protection apparatus issues a trip signal, the circuit breaker breaks a fault current, a reclosing apparatus issues a reclosing signal so that the circuit breaker is closed and carries the fault current, and the relay protection apparatus issues the trip signal again so that the circuit breaker breaks the fault current; and a calculation rule of the opening-to-reclosing-to-reopening time is as follows:

$$T_{opening\text{-}to\text{-}reclosing\text{-}to\text{-}reopening\ time} = \\ T_{moment\ at\ which\ opening\ auxiliary\ contacts\ are\ put\ in\ place\ for\ the\ second\ time} - \\ T_{moment\ at\ which\ the\ opening\ signal\ is\ firstly\ issued} - \\ k_{t\ compensation\ for\ opening\text{-}to\text{-}reclosing\text{-}to\text{-}reopening}$$

wherein $k_{t\ compensation\ for\ opening\text{-}to\text{-}reclosing\text{-}to\text{-}reopening}$ is a dynamic time compensation value obtained by performing, based on the big data and artificial intelligence technologies, mathematical operations on the monitored circuit breaker opening or closing time, the circuit breaker opening or closing time in the power-outage preventive test, the circuit breaker opening or closing time in the handover test, and the period of time during which the opening or closing signal is transmitted in the control circuit;

in the case of the opening of the circuit breaker, primary high-voltage main contacts of the circuit breaker are switched from a closed position to an open position, and secondary auxiliary contacts are synchronously switched from a closed position to an open position, and in this case, a calculation rule of the opening auxiliary contact switching time is as follows:

$$T_{opening\ auxiliary\ contact\ switching} = \\ T_{moment\ at\ which\ opening\ auxiliary\ contacts\ are\ closed} - \\ T_{moment\ at\ which\ closing\ auxiliary\ contacts\ are\ opened} - \\ k_{t\ compensation\ for\ opening\ auxiliary\ contacts\ switching}$$

in the case of the closing of the circuit breaker, the primary high-voltage main contacts of the circuit breaker are switched from the open position to the closed position, and the secondary auxiliary contacts are synchronously switched from the open position to the closed position, and in this case, a calculation rule of the closing auxiliary contact switching time is as follows:

$$T_{closing\ auxiliary\ contact\ switching} = \\ T_{moment\ at\ which\ closing\ auxiliary\ contacts\ are\ closed} - \\ T_{moment\ at\ which\ opening\ auxiliary\ contacts\ are\ opened} - \\ k_{t\ compensation\ for\ closing\ auxiliary\ contact\ switching}$$

wherein $k_{t\ compensation\ for\ opening\ auxiliary\ contact\ switching}$ and $k_{t\ compensation\ for\ closing\ auxiliary\ contact\ switching}$ are dynamic time compensation values obtained by performing, based on the big data and artificial intelligence technologies, mathematical operations on the monitored circuit breaker opening or closing time, the circuit breaker opening or closing time in the power-outage preventive test, the circuit breaker opening or closing time in the handover test, and the period of time during which the opening or closing signal is transmitted in the control circuit;

in a case where the phase-to-phase non-synchronous opening or closing auxiliary contact switching time of the circuit breaker is monitored and analyzed, the phase-to-phase non-synchronous opening or closing auxiliary contact switching time refers to a difference between a maximum switching time and a minimum switching time of the three phases A, B and C, and the smaller a value of the difference is, the better the synchronization is; the synchronization of the opening or closing auxiliary contact switching satisfies the following condition: the phase-to-phase non-synchronous closing time is less than or equal to 5 ms, and the phase-to-phase non-synchronous opening time is less than or equal to 3 ms;

wherein the dynamic time compensation values $k_t$ of the online monitoring apparatus are used to offset time delays of opening or closing signals corresponding to different physical links.

6. The high-voltage circuit breaker opening and closing time online monitoring apparatus according to claim 1, wherein a time monitoring accuracy is based on sampling accuracies of the measurement and control apparatus, the circuit breaker phase selection opening and closing apparatus, the relay protection apparatus and the fault recording apparatus, and wherein resolution of switching value events is more than or equal to 0.1 ms and less than or equal to 1 ms.

7. The high-voltage circuit breaker opening and closing time online monitoring apparatus according to claim 3, wherein technical models for monitoring the opening and closing time of the circuit breaker are independent of a working voltage level of the circuit breaker, a model number of an operating mechanism of the circuit breaker, and a type of a power distribution unit, and are applicable to circuit breakers with different voltage levels and different operating mechanisms, and applicable to GIS (Gas Insulated Switchgear), HGIS (Hybrid Gas Insulated Switchgear) and AIS (Air Insulated Switchgear) high-voltage power distribution units.

8. A smart multi-dimensional big data analyzing expert system for a high-voltage circuit breaker in a power grid, wherein the smart multi-dimensional big data analyzing expert system for a high-voltage circuit breaker in a power grid comprises a high-voltage circuit breaker opening and closing time online monitoring apparatus, data about opening and closing time characteristics of a high-voltage circuit breaker is obtained by online monitoring of the online monitoring apparatus, and the data is derived from a measurement and control apparatus, a circuit breaker phase selection opening and closing apparatus, and a supervisory control and data acquisition system of each of a substation and a converter station; a relay protection apparatus and a relay protection information system; and a fault recording apparatus and a fault recording information system, and wherein the online monitoring apparatus provides real-time monitored data and historical data about a power grid, with the real-time monitored data and historical data for performing the online monitoring of the opening and closing time of the circuit breaker, the smart multi-dimensional big data analyzing expert system for a high-voltage circuit breaker in a power grid comprises a circuit breaker cluster cloud database and a smart expert decision terminal, the circuit breaker cluster cloud database comprises a real-time circuit breaker monitoring database, a circuit breaker technique supervision database, a circuit breaker security risk technical indicator database and a circuit breaker warehouse spare part database, the smart expert decision terminal comprises a device security risk evaluation module, an optimal device maintenance solution ranking module and a mobile terminal online dynamic warning module, the circuit breaker cluster cloud database dynamically acquires data, and the smart expert decision terminal performs history data analysis, trend analysis, variable analysis, comparison analysis and factor analysis on the acquired data.

9. The smart multi-dimensional big data analyzing expert system for a high-voltage circuit breaker in a power grid according to claim 8, wherein data in the circuit breaker technique supervision database comprises inherent design parameters of the circuit breaker, and the inherent design parameters comprise waveforms of opening and closing operations, opening and closing speeds, opening and closing time, overtravel, opening range, bounce, voltage and current of opening and closing coils, as well as an action time and power of an iron core.

10. The smart multi-dimensional big data analyzing expert system for a high-voltage circuit breaker in a power grid according to claim 8, wherein data in the real-time circuit breaker monitoring database comprises a working voltage, a working current, states of opening and closing coils, positions of three-phase contacts, a counter for opening and closing actions, a state of an operating mechanism, a counter for actions of applying a voltage to a motor, a pressure of $SF_6$ gas, a position of an isolation switch, and a position of a grounded knife switch, which are acquired from a substation automation system and a field measurement and control apparatus;

data in the real-time circuit breaker monitoring database also comprises action processes and breaking current values of the circuit breaker, which are acquired from a relay protection management information system, a circuit breaker protection apparatus, a line protection apparatus and a relevant-element protection apparatus;

the data in the real-time circuit breaker monitoring database also comprises a value of a fault current broken by the circuit breaker and an action process of the three-phase contacts, which are acquired from the fault recording apparatus.

11. A method of monitoring a circuit breaker using a smart multi-dimensional big data analyzing expert system for a high-voltage circuit breaker in a power grid, comprising steps of:

obtaining, by a high-voltage circuit breaker opening and closing time online monitoring apparatus, online-monitored data about opening and closing time characteristics of a high-voltage circuit breaker, and acquiring, from a substation automation system and a field measurement and control apparatus, working parameters of a circuit breaker in a power grid, wherein the working parameters comprise a working voltage and a working current of the circuit breaker, states of opening and closing coils, positions of three-phase contacts, a counter for opening and closing actions, a state of an operating mechanism, a counter for actions of applying a voltage to a motor, a pressure of $SF_6$ gas, a position of an isolation switch, and a position of a grounded knife switch;

acquiring action processes and breaking current values of the circuit breaker, from a relay protection management information system, a circuit breaker protection apparatus, a line protection apparatus, and a relevant-element protection apparatus of the substation;

acquiring, from a fault recording apparatus, a value of a fault current broken by the circuit breaker and an action process of the three-phase contacts;

acquiring, from a circuit breaker cluster cloud database, inherent parameters related to the circuit breaker, wherein the inherent parameters comprise national technical standards for circuit breakers, design parameters of manufacturers of circuit breakers, debugging and acceptance parameters, device defect records, device reliability statistics, action characteristic inspection, power-outage preventive test and $SF_6$ gas inspection;

performing history data analysis, trend analysis, variable analysis, comparison analysis and factor analysis, based on the acquired working parameters of the circuit breaker and the acquired inherent parameters related to the circuit breaker; and invoking, based on the analysis results, a device security risk evaluation module, an optimal device maintenance solution ranking module and a mobile terminal online dynamic warning module, to obtain a running and maintenance decision recommendation.

12. The method of monitoring a circuit breaker using a smart multi-dimensional big data analyzing expert system for a high-voltage circuit breaker in a power grid according to claim 11, wherein the step of obtaining, by a high-voltage circuit breaker opening and closing time online monitoring apparatus, online-monitored data about opening and closing time characteristics of a high-voltage circuit breaker comprises:

acquiring, from a SCADA (Supervisory Control And Data Acquisition) system, the field measurement and control apparatus and a circuit breaker phase selection opening and closing apparatus of each of a substation and a converter station, a remote communication signal, a remote measurement signal, a remote control signal and a relay protection action signal of the circuit breaker, as well as information about actions of the circuit breaker phase selection opening and closing apparatus, to create real-time data and historical data thereof;

acquiring protection action information from a relay protection information system and a relay protection apparatus;

acquiring recorded fault information from a fault recording system and a fault recording apparatus;

extracting and cleaning the protection action information, the recorded fault information and the real-time data and historical data thereof, and generating a circuit breaker opening and closing events database;

extracting, by using an intelligent opening and closing strategy analysis strategy module, signal data related to opening and closing actions of the circuit breaker from the circuit breaker opening and closing events database, wherein the intelligent opening and closing strategy analysis strategy module is composed by an opening and closing signal cleaning strategy module and a big data analysis module, with the opening and closing signal cleaning strategy module based on artificial intelligence technology; and sending the signal data extracted by the intelligent opening and closing strategy analysis module to nine time monitoring modules simultaneously for comprehensive analysis as follows:

calculating, by an opening time monitoring module, a circuit breaker opening time;

calculating, by a phase-to-phase non-synchronous opening time monitoring module, a phase-to-phase non-synchronous opening time;

calculating, by a closing time monitoring module, a circuit breaker closing time;

calculating, by a phase-to-phase non-synchronous closing time monitoring module, a phase-to-phase non-synchronous closing time;

calculating, by a closing-opening time monitoring module, a closing-opening time;

calculating, by an opening-to-reclosing time monitoring module, an opening-to-reclosing time;

calculating, by an opening-to-reclosing-to-reopening time monitoring module, an opening-to-reclosing-to-reopening time; and calculating, by an opening or closing auxiliary contact switching time monitoring module, an opening or closing auxiliary contact switching time; and calculating, by a phase-to-phase non-synchronous opening or closing auxiliary contact switching time monitoring module, a phase-to-phase non-synchronous opening or closing auxiliary contact switching time.

13. The method of monitoring a circuit breaker using a smart multi-dimensional big data analyzing expert system for a high-voltage circuit breaker in a power grid according to claim 11, wherein the circuit breaker cluster cloud database comprises a real-time circuit breaker monitoring database for providing real-time working parameters of the circuit breaker, a circuit breaker technique supervision database for providing inherent parameters of the circuit breaker, a circuit breaker security risk technical indicator database for providing security risk technical indicators of the circuit breaker, and a circuit breaker warehouse spare part database for providing specification data of the circuit breaker.

14. The method of monitoring a circuit breaker using a smart multi-dimensional big data analyzing expert system for a high-voltage circuit breaker in a power grid according to claim 11, wherein data in the circuit breaker technique supervision database for providing inherent parameters of the circuit breaker comprises: waveforms of opening and closing operations, opening and closing speeds, opening and closing time, overtravel, opening range, bounce, voltage and current of opening and closing coils, as well as an action time and power of an iron core.

15. The method of monitoring a circuit breaker using a smart multi-dimensional big data analyzing expert system for a high-voltage circuit breaker in a power grid according to claim 11, wherein the circuit breaker security risk technical indicator database for providing security risk technical indicators of the circuit breaker comprises a power grid system risk database, a circuit breaker ontological risk database, and an inspection and repair task risk database.

16. The method of monitoring a circuit breaker using a smart multi-dimensional big data analyzing expert system for a high-voltage circuit breaker in a power grid according to claim 11, wherein data in the circuit breaker warehouse spare part database for providing specification data of the circuit breaker comprises: a brand of a main device; and names, specifications and model numbers of spare parts.

17. A method of monitoring a circuit breaker using a smart multi-dimensional big data analyzing expert system for a high-voltage circuit breaker in a power grid according to claim 12, wherein the step of obtaining by a high-voltage circuit breaker opening and closing time online monitoring apparatus the online-monitored data about opening and closing time characteristics of a high-voltage circuit breaker further comprises: performing, by utilizing artificial intelligence, big data and cloud computing technologies, data mining on time parameters and historical data thereof of each of the substation and the converter station, the time parameters and historical data thereof being in an online monitoring cloud database, and the data mining comprises:

comparing and ranking the time of manual opening or closing, and paying attention to a trend of historical change in the time of manual opening or closing;

comparing and ranking the opening or closing time, and paying attention to a trend of historical change in the phase-to-phase non-synchronous opening or closing time;

ranking a protective opening and reclosing time, and paying attention to a trend of historical change in the protective opening and reclosing time;

analyzing, for successful opening-to-reclosing and for the opening-to-reclosing-to-reopening, the circuit breaker control circuit and mechanical action characteristics of the circuit breaker main body, and paying attention to trends of historical changes in the circuit breaker control circuit and the mechanical action characteristics of the circuit breaker main body over time;

acquiring information about an operation command issued by the SCADA, information about the circuit breaker phase selection opening and closing apparatus, and a moment at which positions of auxiliary contacts of the circuit breaker are changed, and inspecting whether the circuit breaker phase selection opening and closing apparatus accurately responds to the operation command issued by the SCADA;

monitoring and calculating a period of time required from a moment at which an opening or closing signal is issued to a moment at which an opening or closing action of the circuit breaker is completed, and ranking the period of time in terms of change in length, so as to judge whether the opening and closing control circuit and the circuit breaker main body are in a good state;

performing, for a circuit breaker in which three phases are synchronously driven, a statistical analysis of a change trend of the closing-opening time of the circuit breaker; and performing, for a circuit breaker operated in single phase, a statistical analysis of a change trend of the closing-opening time for each of the three phases, and comparing the change trends of the closing-opening time among the three phases;

ranking the opening auxiliary contact switching time and the closing auxiliary contact switching time in terms of length, respectively, and paying attention to the trends of historical changes in the opening auxiliary contact switching time and the closing auxiliary contact switching time;

monitoring the opening time, the closing time, the phase-to-phase non-synchronous opening time, the phase-to-phase non-synchronous closing time and the phase-to-phase non-synchronous opening or closing auxiliary contact switching time, and sending a warning and incorporating the warning into a warning list if the opening time, the closing time, the phase-to-phase non-synchronous opening time, the phase-to-phase non-synchronous closing time or the phase-to-phase non-synchronous opening or closing auxiliary contact switching time exceeds a threshold value;

wherein results of the above data mining are used to diagnose an abnormality of the operating mechanism of the circuit breaker main body, an abnormality of the control circuit, and an abnormality of the circuit breaker phase selection opening and closing apparatus.

* * * * *